United States Patent
Okada et al.

(10) Patent No.: US 10,068,647 B2
(45) Date of Patent: Sep. 4, 2018

(54) SEMICONDUCTOR MEMORY DEVICE

(71) Applicant: Toshiba Memory Corporation, Tokyo (JP)

(72) Inventors: Nobuaki Okada, Yokohama Kanagawa (JP); Toshiki Hisada, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/233,662

(22) Filed: Aug. 10, 2016

(65) Prior Publication Data

US 2017/0221564 A1    Aug. 3, 2017

(30) Foreign Application Priority Data

Feb. 3, 2016   (JP) ................................. 2016-019265

(51) Int. Cl.
| | | |
|---|---|---|
| G11C 11/34 | (2006.01) | |
| G11C 16/04 | (2006.01) | |
| G11C 16/08 | (2006.01) | |
| G11C 16/10 | (2006.01) | |
| G11C 16/16 | (2006.01) | |
| G11C 16/26 | (2006.01) | |

(52) U.S. Cl.
CPC .......... *G11C 16/0483* (2013.01); *G11C 16/08* (2013.01); *G11C 16/10* (2013.01); *G11C 16/16* (2013.01); *G11C 16/26* (2013.01)

(58) Field of Classification Search
CPC ..... G11C 16/0483; G11C 16/08; G11C 16/10; G11C 16/16; G11C 16/26
USPC .............. 365/185.11, 185.05, 185.12
See application file for complete search history.

(56) References Cited

U.S. PATENT DOCUMENTS

| | | | | |
|---|---|---|---|---|
| 6,084,820 A | * | 7/2000 | Raszka ................ | G11C 8/16 365/230.05 |
| 6,839,283 B1 | | 1/2005 | Futatsuyama et al. | |
| 7,057,915 B2 | | 6/2006 | Futatsuyama | |
| 7,738,313 B2 | | 6/2010 | Futatsuyama | |
| 7,859,901 B2 | | 12/2010 | Iwai et al. | |

(Continued)

FOREIGN PATENT DOCUMENTS

| | | |
|---|---|---|
| JP | 2000-076880 A | 3/2000 |
| JP | 2005-191413 A | 7/2005 |

(Continued)

OTHER PUBLICATIONS

Taiwan Office Action dated Aug. 15, 2017, filed in Taiwan counterpart Application No. 105121120, 8 pages (with translation).

*Primary Examiner* — Viet Q Nguyen
(74) *Attorney, Agent, or Firm* — Patterson & Sheridan, LLP

(57) ABSTRACT

A semiconductor memory device includes a first block that includes a first set of word lines, a second block that includes a second set of word lines and is adjacent to the first block in a first direction, a first transistor group adjacent to the first and second blocks in a second direction crossing the first direction, and a second transistor group adjacent to the first transistor group in the second direction. Each of the word lines in the first set is electrically connected to a transistor in the first transistor group, and each of the word lines in the second set is electrically connected to a transistor in the first transistor group.

9 Claims, 14 Drawing Sheets

(56) References Cited

U.S. PATENT DOCUMENTS

| | | | |
|---|---|---|---|
| 7,933,151 B2* | 4/2011 | Maeda | G11C 5/02 |
| | | | 365/185.11 |
| 9,570,176 B2* | 2/2017 | Jung | G11C 16/10 |
| 2002/0175364 A1* | 11/2002 | Ichige | H01L 27/115 |
| | | | 257/314 |
| 2002/0196684 A1* | 12/2002 | Kyung | G11C 29/808 |
| | | | 365/200 |
| 2003/0031054 A1* | 2/2003 | Lee | G11C 16/0483 |
| | | | 365/185.17 |
| 2003/0151943 A1* | 8/2003 | Sadakata | G11C 11/405 |
| | | | 365/149 |
| 2008/0094900 A1 | 4/2008 | Nakamura et al. | |
| 2008/0273414 A1* | 11/2008 | Wang | G11C 5/025 |
| | | | 365/230.03 |
| 2008/0316825 A1* | 12/2008 | Hwang | G11C 7/227 |
| | | | 365/185.11 |
| 2009/0244968 A1* | 10/2009 | Maejima | G11C 11/5628 |
| | | | 365/185.03 |
| 2010/0214838 A1* | 8/2010 | Hishida | G11C 8/08 |
| | | | 365/185.11 |
| 2011/0019477 A1 | 1/2011 | Hashimoto et al. | |
| 2011/0149629 A1* | 6/2011 | Shim | G11C 7/18 |
| | | | 365/63 |
| 2012/0212989 A1 | 8/2012 | Yu et al. | |
| 2012/0263005 A1* | 10/2012 | Barkley | G11C 5/025 |
| | | | 365/230.03 |
| 2013/0194868 A1* | 8/2013 | Hashimoto | G11C 16/0483 |
| | | | 365/185.11 |
| 2014/0086001 A1* | 3/2014 | Fukano | G11C 8/10 |
| | | | 365/230.03 |
| 2014/0247658 A1* | 9/2014 | Hosono | G11C 16/24 |
| | | | 365/185.11 |
| 2015/0055430 A1* | 2/2015 | Kim | G11C 11/4085 |
| | | | 365/230.04 |
| 2015/0187428 A1 | 7/2015 | Okada et al. | |
| 2017/0063378 A1* | 3/2017 | Tate | H03K 19/1776 |
| 2017/0249994 A1* | 8/2017 | Hashimoto | G11C 16/0483 |

FOREIGN PATENT DOCUMENTS

| | | |
|---|---|---|
| JP | 2008-084457 A | 4/2008 |
| JP | 2009-141278 A | 6/2009 |

\* cited by examiner

FIG. 13
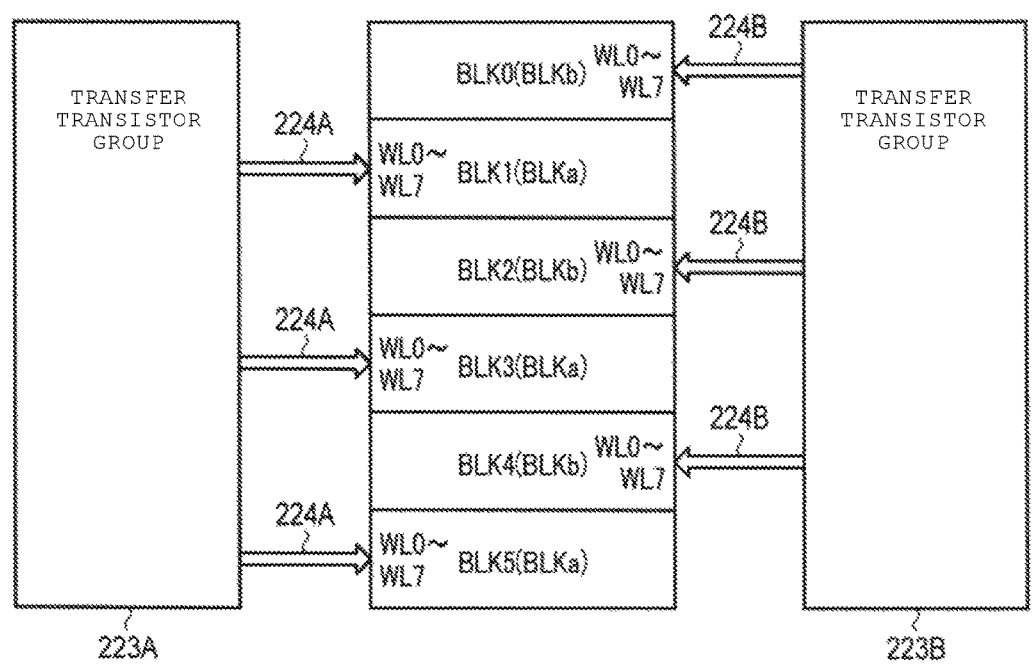
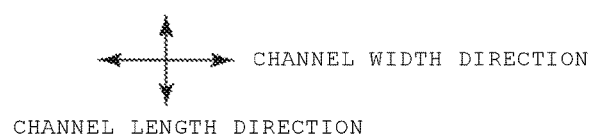

US 10,068,647 B2

SEMICONDUCTOR MEMORY DEVICE

CROSS-REFERENCE TO RELATED APPLICATION

This application is based upon and claims the benefit of priority from Japanese Patent Application No. 2016-019265, filed on Feb. 3, 2016, the entire contents of which are incorporated herein by reference.

FIELD

Embodiments described herein relate generally to a semiconductor memory device.

BACKGROUND

A NAND type flash memory is known in which memory cells are three-dimensionally arranged.

DESCRIPTION OF THE DRAWINGS

FIG. 13 is a layout diagram illustrating a modification example of the row decoder of the semiconductor memory device according to the fourth embodiment.

DETAILED DESCRIPTION

Figure 1:
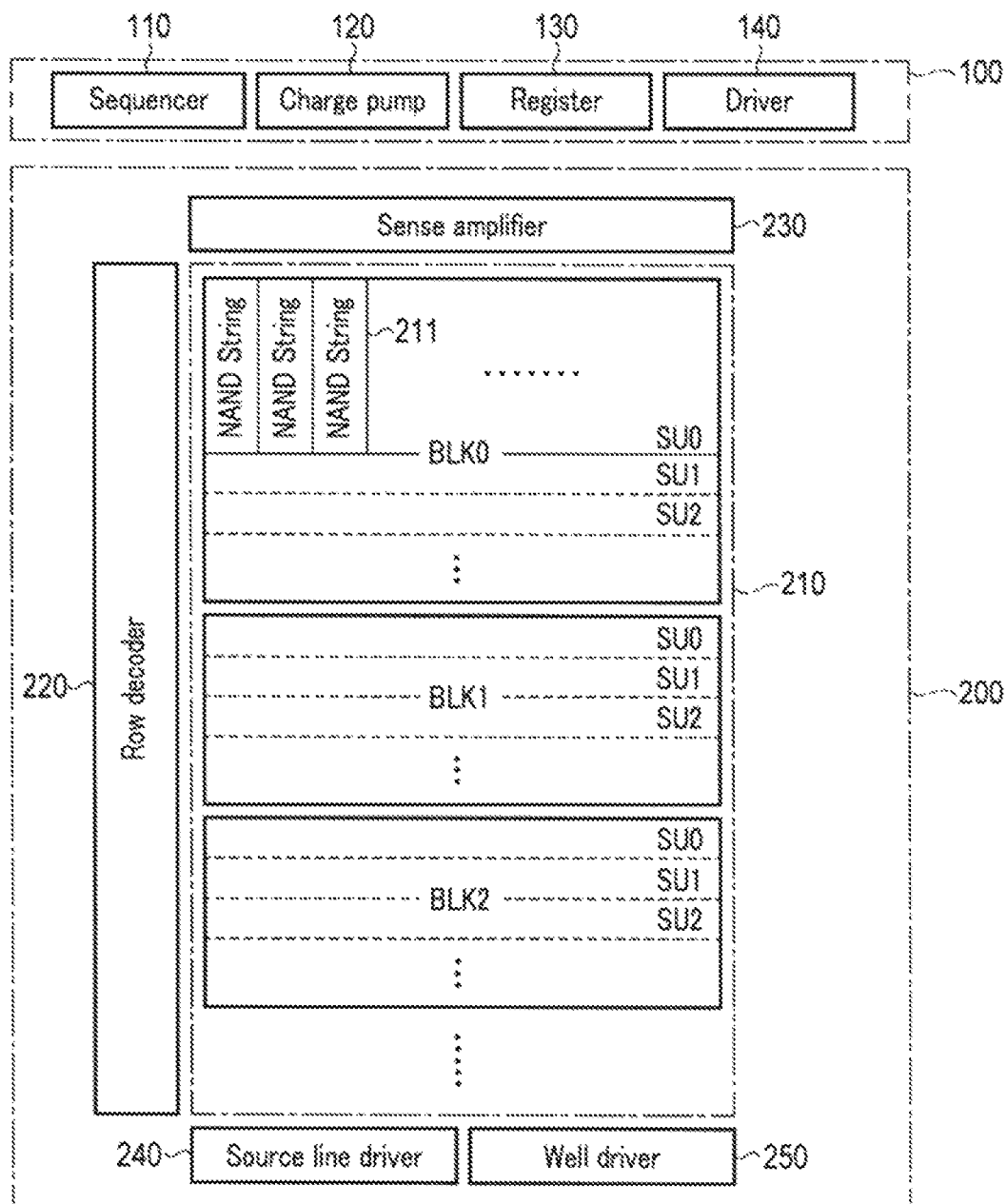
FIG. 1 is a block diagram illustrating a semiconductor memory device according to a first embodiment.

In general, according to one embodiment, a semiconductor memory device includes a first block that includes a first set of word lines, a second block that includes a second set of word lines and is adjacent to the first block in a first direction, a first transistor group adjacent to the first and second blocks in a second direction crossing the first direction, and a second transistor group adjacent to the first transistor group in the second direction. Each of the word lines in the first set is electrically connected to a transistor in the first transistor group, and each of the word lines in the second set is electrically connected to a transistor in the first transistor group.

The present embodiments will be described with reference to the accompanying drawings. The same symbols or reference numerals will be attached to the same units in the drawings.

First Embodiment

Hereinafter, a semiconductor memory device according to a first embodiment will be described with reference to FIG. 1 to FIG. 7. Here, an example in which a NAND type flash memory of a three-dimensional stacked type is used as a semiconductor memory device will be described.

Entire Configuration Example According to First Embodiment

As illustrated in FIG. 1, the semiconductor memory device (in this example, a NAND type flash memory) includes a core unit 200 and a peripheral circuit 100.

The core unit 200 includes a memory cell array 210, a row decoder 220, a sense amplifier 230, a source line driver 240, and a well driver 250.

The memory cell array 210 includes multiple blocks BLK (BLK0, BLK1, BLK2, ...). Each of the blocks BLK is a set of nonvolatile memory cells. Each nonvolatile memory cell is connected to each other via a word line and a bit line. Each of the blocks BLK is an erasure unit of data, and the data in the same block BLK is collectively erased. Each of the blocks BLK includes multiple sting units (SU0, SU1, SU2, ...). Each of the string units SU is a set of NAND strings 211 in which memory cells are directly connected to each other. The number of the blocks in the memory cell array 210 and the number of the string units in each of the blocks BLK are arbitrary.

The data in the blocks BLK is not limited to being collectively erased, and may be erased by a unit smaller than the block, for example, a half block (HBL). A case where the data in the blocks BLK is erased by a unit smaller than the block is described in, for example, U.S. patent application Ser. No. 13/235,389 filed on Sep. 18, 2011 and entitled "NONVOLATILE SEMICONDUCTOR MEMORY DEVICE" and U.S. patent application Ser. No. 12/694,690 filed on Jan. 27, 2010 and entitled "NONVOLATILE SEMICONDUCTOR MEMORY DEVICE". The entire contents of these applications are incorporated by reference herein.

The row decoder 220 decodes a block address or a page address, and selects one of the word lines in the corresponding block BLK. In addition, the row decoder 220 applies appropriate voltages to the selected word line and unselected word lines. The row decoder 220 will be described in detail below.

When data is read, the sense amplifier 230 senses data stored in the memory cell through the bit line. In addition, when data is written, the sense amplifier 230 transmits write data to the memory cell through the bit line.

The source line driver 240 applies a voltage to a source line.

The well driver 250 applies a voltage to a well region in which the NAND strings 211 are formed.

The peripheral circuit 100 includes a sequencer 110, a charge pump 120, a register 130, and a driver 140.

The sequencer 110 controls the operation of the NAND type flash memory.

The charge pump 120 boosts a power supply voltage which is provided from the outside, and supplies a required voltage to the driver 140.

The driver 140 supplies voltages required for writing, reading, and erasing data to the row decoder 220, the sense amplifier 230, the source line driver 240, and the well driver 250.

The register 130 retains various information. For example, the register 130 retains status of a write operation or an erasure operation of data, and according to this, notifies a controller (not illustrated) of whether or not the operation is normally completed. In addition, the register 130 can also retain various tables.

Configuration Example of Memory Cell Array According to First Embodiment

Figure 2:
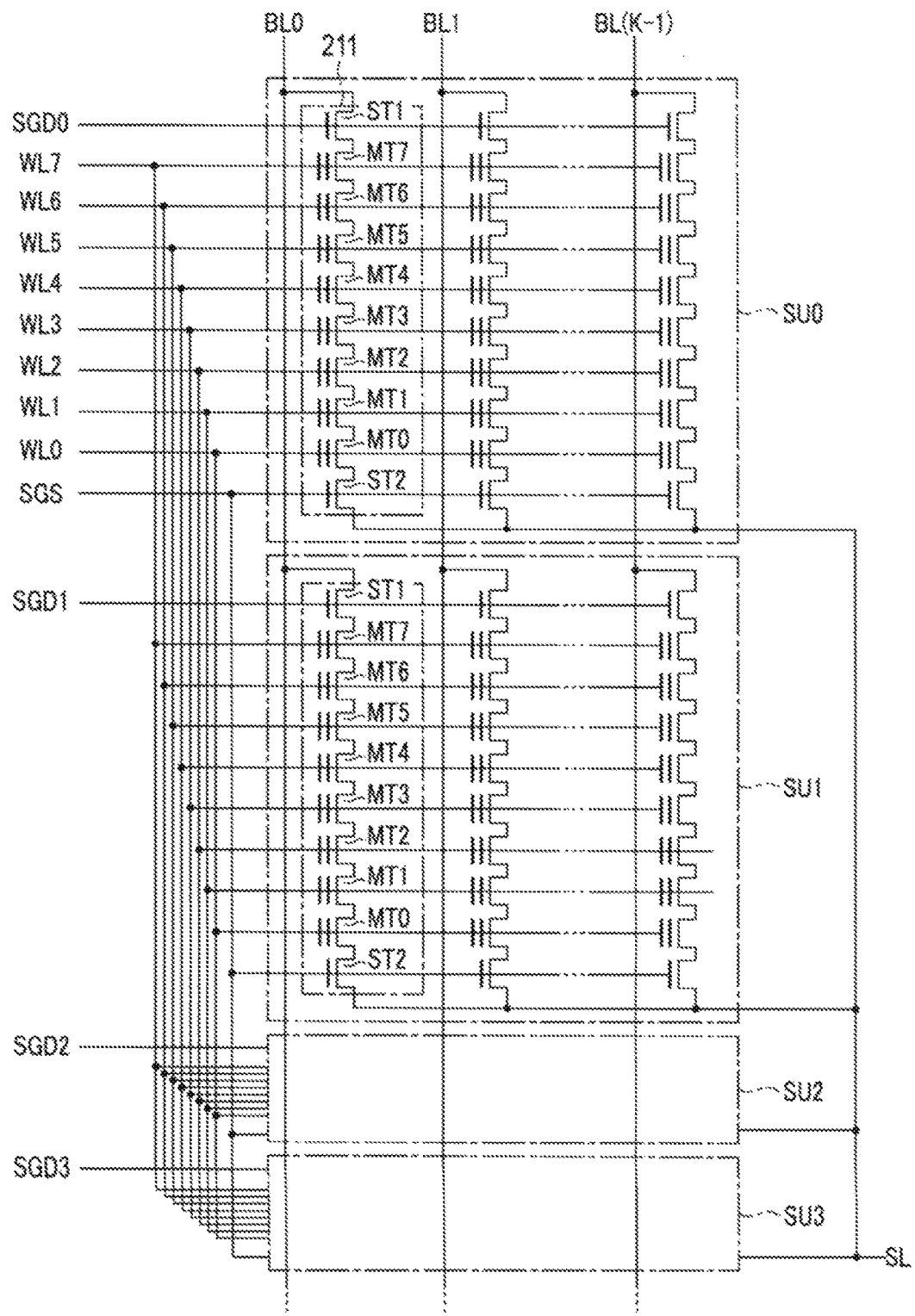
FIG. 2 is a circuit diagram illustrating a memory cell array of the semiconductor memory device according to the first embodiment.

FIG. 2 illustrates one block BLK.

As illustrated in FIG. 2, the block BLK includes, for example, four string units SU (SU0 to SU3). In addition, each of the string units SU includes the multiple NAND strings 211.

Each of the NAND strings 211 includes, for example, eight memory cell transistors MT (MT0 to MT7), and select transistors ST1 and ST2. The memory cell transistor MT includes a stacked gate having a control gate and an electric charge storage layer, and retains data in a nonvolatile manner. The number of the memory cell transistors MT is not limited to 8, and may be 16, 32, 64, 128, or the like. There is no limitation on the number of the memory cell transistors MT. A current path of the memory cell transistors MT0 to MT7 is formed in series. One terminal of the memory cell transistor MT7 which is on one end side is connected to one terminal of the select transistor ST1, and one terminal of the memory cell transistor MT0 which is on the other end is connected to one terminal of the select transistor ST2.

Each gate of the select transistors ST1 of the string units SU0 to SU3 is connected in common to each of the select gate lines SGD0 to SGD3. Meanwhile, gates of the select transistors ST2 are connected in common to the same select gate line SGS, across the multiple string units. In addition, control gates of the memory cell transistors MT0 to MT7 in the same block BLK are respectively connected in common to word lines WL0 to WL7.

That is, the word lines WL0 to WL7 and the select gate line SGS are respectively connected in common to each other, across the multiple string units SU0 to SU3 in the same block. Meanwhile, the select gate lines SGD are independent in each of the string units SU0 to SU3, even within the same block BLK.

In addition, the other terminals of the select transistors ST1 of the NAND strings 211 in the same column, among the NAND strings 211 which are arranged in a matrix in the memory cell array 210, are connected in common to one of bit lines BL (BL0 to BL(K−1), (K−1) is a natural number equal to or greater than 1). That is, the bit lines BL are connected in common to the NAND strings 211, across the multiple string units SU. In addition, the other terminals of the select transistors ST2 are connected in common to a source line SL. The source line SL is connected in common to the NAND strings 211, for example, across multiple blocks.

The gates of the select transistors ST1 of each of the string units SU0 to SU3 are connected in common to each of the select gate lines SGD0 to SGD3, respectively. Meanwhile, the gates of the select transistor ST2 are connected in common to the same select gate line SGS, across the multiple string units. In addition, the control gates of the memory cell transistors MT0 to MT5 in the same block are respectively connected in common to the word lines WL0 to WL5.

That is, the word lines WL0 to WL5 and the select gate line SGS are respectively connected in common to each other, across the multiple string units SU0 to SU3 in the same block BLK. In contrast to this, the select gate lines SGD0 to SGD3 are independent in each of the string units SU0 to SU3, even within the same block.

Data of the memory cell transistors MT in the same block are erased, for example, collectively. In contrast to this, reading and writing of data are collectively performed with respect to the multiple memory cell transistors MT, which are connected in common to any one word line WL, in any one string units SU of any one block. Such a data unit is called a "page".

Figure 3:
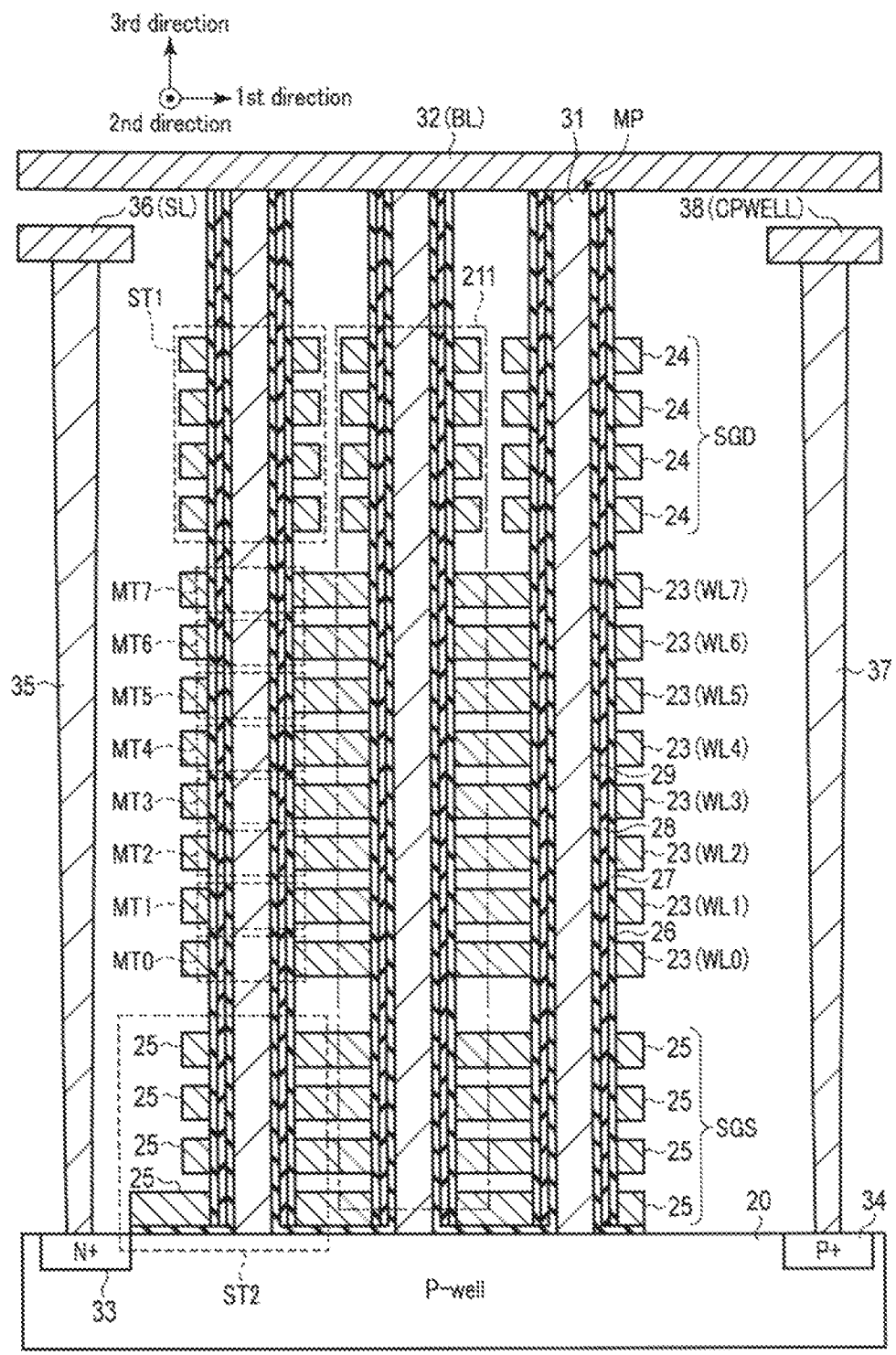
FIG. 3 is a sectional diagram illustrating the memory cell array of the semiconductor memory device according to the first embodiment.

As illustrated in FIG. 3, the multiple NAND strings 211 are provided on a p-type well region 20 of a semiconductor substrate.

More specifically, the memory pillars MP extend in a third direction (stacked direction) on the p-type well region 20 of the semiconductor substrate. The memory pillar MP includes a semiconductor layer 31, a tunnel insulating layer 29, an electric charge storage layer 28, and a block insulating layer 27. The semiconductor layer 31 functions as a current path of the NAND strings 211, and forms a channel when the memory cell transistors MT and the select transistors ST operate. The tunnel insulating layer 29, the electric charge storage layer 28, and the block insulating layer 27 are sequentially provided so as to cover the periphery of the semiconductor layer 31. In addition, multiple wire layers 25, multiple wire layers 23, and multiple wire layers 24 are sequentially provided from a lower side in the third direction, and each cover the periphery of the block insulating layer 27.

The multiple wire layers 25 function as the select gate lines SGS, the multiple wire layers 23 function as the word lines WL, and the multiple wire layers 24 function as the select gate lines SGD. The select gate line SGD extends in a second directions (depth direction of paper).

The select transistor ST2 includes the memory pillar MP and the multiple wire layers 25. In addition, the memory cell transistor MT includes the memory pillar MP and the multiple wire layers 23. In addition, the select transistor ST1 includes the memory pillar MP and the multiple wire layers 24.

Here, the multiple (four layers in the present example) wire layers 25 are electrically connected in common to each other, and are connected to the same select gate lines SGS. That is, the wire layers 25 of four layers actually function as a gate electrode of one select transistor ST2. The same is used for the select transistor ST1 (the select gate line SGD of four layers).

By the aforementioned configuration, the select transistor ST2, the memory cell transistors MT, and the select transistor ST1 are sequentially stacked on the p-type well region 20 in each of the NAND strings 211. The string unit SU includes the multiple NAND strings 211 which are arranged in the second direction.

A wire layer 32 which functions as a bit line BL is provided on upper ends of the memory pillars MP. The bit line BL extends a first direction (lateral direction of paper), and is connected to the sense amplifier 230.

Furthermore, an N$^+$-type impurity diffusion layer 33 and a P$^+$-type impurity diffusion layer 34 are provided on a surface of the p-type well region 20. A contact plug 35 is provided on the N$^+$-type impurity diffusion layer 33, and a wire layer 36 which functions as the source line SL is provided on the contact plug 35. The source line SL is connected to the source line driver 240. In addition, a contact plug 37 is provided on the P$^+$-type impurity diffusion layer 34, and a wire layer 38 which functions as a well wire CPWELL is provided on the contact plug 37. The well wire CPWELL is connected to the well driver 250. The wire layers 36 and 38 are layers higher than the select gate line SGD, and are layers lower than the wire layer 32. The wire layer 38 which functions as the well wire CPWELL does not need to be provided in the memory cell array 210.

In addition, a gate insulation layer (tunnel insulating layer 29) is formed between the p-type well region 20 and the wire layers 25 which is a lowermost layer, and the wire layers 25 and the gate insulation layer are formed up to the vicinity of the N$^+$-type impurity diffusion layer 33. Accordingly, when the select transistor ST2 which is the lowermost layer is turned on, a channel is formed not only in the semiconductor layer 31 but also on a surface of the p-type well region 20. That is, the select transistor ST2 on an upper side is electrically connected to the N$^+$-type impurity diffusion layer 33 by the select transistor ST2 which is the lowermost layer. Accordingly, a potential can be provided to the channel of the semiconductor layer 31 by applying a voltage to the diffusion layer 33 (source line SL). Meanwhile, the semiconductor layer 31 is connected to the well region 20. Hence, also by applying a voltage to the well region 20, a potential can be provided to the channel.

The memory cell array 210 may have a different configuration from the aforementioned configuration. That is, other configurations of the memory cell array 210 are described in, for example, U.S. patent application Ser. No. 12/407,403 filed on Mar. 19, 2009 and entitled "THREE DIMENSIONAL STACKED NONVOLATILE SEMICONDUCTOR MEMORY," U.S. patent application Ser. No. 12/406,524 filed on Mar. 18, 2009 and entitled "THREE DIMENSIONAL STACKED NONVOLATILE SEMICONDUCTOR MEMORY," U.S. patent application Ser. No. 12/679,991 filed on Mar. 25, 2010 and entitled "NONVOLATILE SEMICONDUCTOR STORAGE DEVICE AND METHOD OF MANUFACTURING THE SAME," and U.S. patent application Ser. No. 12/532,030 filed on Mar. 23, 2009 and entitled "SEMICONDUCTOR MEMORY AND METHOD FOR MANUFACTURING SAME." All of these patent applications are incorporated by reference herein.

Configuration Example of Row Decoder According to First Embodiment

Figure 4:
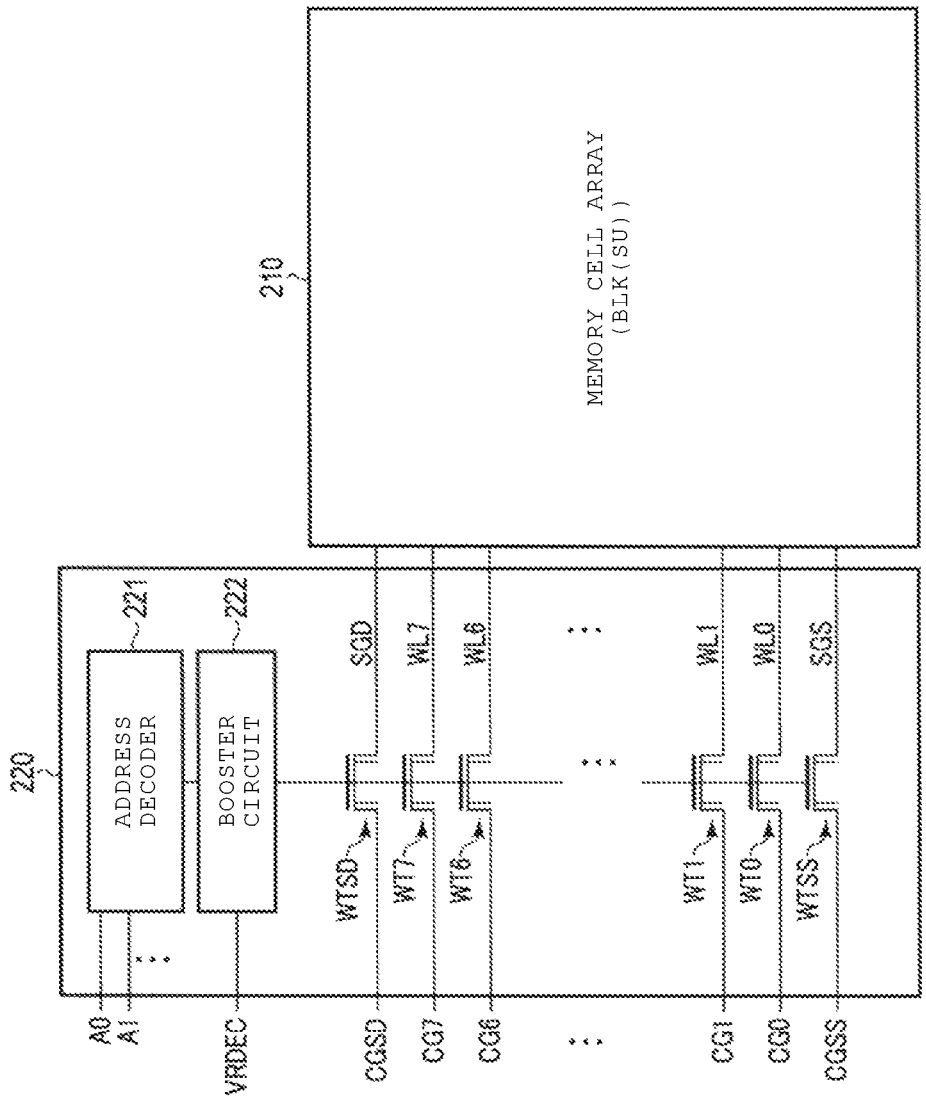
FIG. 4 is a block diagram illustrating a row decoder of the semiconductor memory device according to the first embodiment.

FIG. 4 illustrates a connection relationship between the row decoder 220 and the word lines WL0 to WL7 connected to one string unit SU of one block BLK in the memory cell array 210.

As illustrated in FIG. 4, the row decoder 220 includes an address decoder 221, a booster circuit 222, and transfer transistors WT (WT0 to WT7, WTSS, and WTSD).

The address decoder 221 selects the blocks BLK according to input addresses A (A0, A1, A2, ... ). The booster circuit 222 supplies a boost voltage to gates of the transfer transistors WT. The booster circuit 222 receives a drive voltage VRDEC for the row decoder.

One terminal (any one of a source and a drain) of each of the transfer transistors WT0 to WT7 is electrically connected to one of the word lines WL0 to WL7. In addition, the other terminal of (the other of the source and the drain) each of the transfer transistors WT0 to WT7 is electrically connected to one of control gate lines CG0 to CG7. One terminal (any one of a source and a drain) of each of the transfer transistors WTSD and WTSS is electrically connected to one of the select gate lines SGD and SGS. In addition, the other terminal (the other of the source and the drain) of each of the transfer transistors WTSD and WTSS is electrically connected to one of control gate lines CGSD and CGSS. The transfer transistors WT0 to WT7 may have the same configuration as the transfer transistors WTSD and WTSS.

A case in which there are eight word lines WL0 to WL7 in FIG. 5 will be described, in the same manner as in FIG. 4. In addition, FIG. 5 illustrates six blocks BLK0 to BLK5 in the memory cell array 210.

Figure 5:
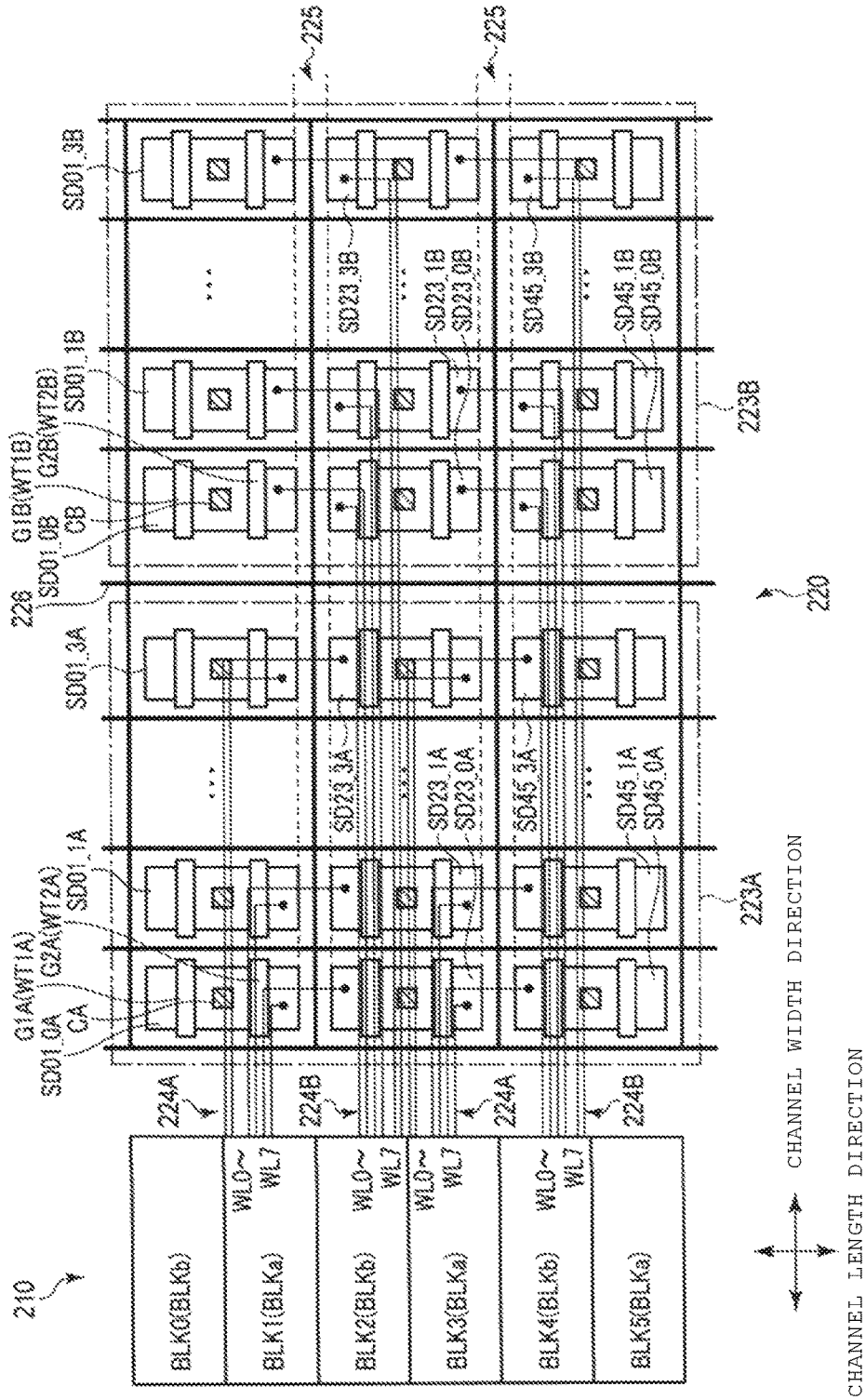
FIG. 5 is a layout diagram illustrating the row decoder of the semiconductor memory device according to the first embodiment.

As illustrated in FIG. 5, the row decoder 220 includes a transfer transistor group 223A for blocks BLKa (blocks BLK1, BLK3, and BLK5), and a transfer transistor group 223B for blocks BLKb (blocks BLK0, BLK2, and BLK4).

The transfer transistor group 223A is provided adjacent to the memory cell array 210 in a channel width direction. The transfer transistor group 223B is provided adjacent to the transfer transistor group 223A in the channel width direction. The transfer transistor group 223A is arranged between the memory cell array 210 and the transfer transistor group 223B in the channel width direction.

The transfer transistor group 223A connects the word lines WL0 to WL7 of the blocks BLKa (BLK1, BLK3, and BLK5) to the control gate lines CG0 to CG7, respectively. Meanwhile, the transfer transistor group 223B connects the word lines WL0 to WL7 of the blocks BLKb (BLK0, BLK2, and BLK4) to the control gate lines CG0 to CG7, respectively.

The transfer transistor group 223A includes diffusion layer regions SD (SD01_0A to SD01_3A, SD23_0A to SD23_3A, and SD45_0A to SD45_3A). The diffusion layer regions SD01_0A to SD01_3A are aligned in the channel width direction. Dimensions of the diffusion layer regions SD01_0A to SD01_3A in a channel length direction correspond to two blocks. Upper ends of the diffusion layer regions SD01_0A to SD01_3A in the channel length direction are located in the vicinity of an upper end of the block BLK0, and lower ends of the diffusion layer regions SD01_0A to SD01_3A in the channel length direction are located in the vicinity of a lower end of the block BLK1.

In the same manner, upper ends of the diffusion layer regions SD23_0A to SD23_3A in the channel length direction are located in the vicinity of an upper end of the block BLK2, and lower ends of the diffusion layer regions SD23_0A to SD23_3A in the channel length direction are located in the vicinity of a lower end of the block BLK3. In addition, upper ends of the diffusion layer regions SD45_0A to SD45_3A in the channel length direction are located in the vicinity of an upper end of the block BLK4, and lower ends of the diffusion layer regions SD45_0A to SD45_3A in the channel length direction are located in the vicinity of a lower end of the block BLK5.

That is, an element isolation area 225 between the diffusion layer regions SD01_0A to SD01_3A and the diffusion layer regions SD23_0A to SD23_3A is located between the block BLK1 and the block BLK2 in the channel length direction. In addition, the element isolation area 225 between the diffusion layer regions SD23_0A to SD23_3A and the diffusion layer regions SD45_0A to SD45_3A is located at a boundary between the block BLK3 and the block BLK4 in the channel length direction.

Gates G1A and G2A and contacts CA are respectively provided on the diffusion layer regions SD in the transfer transistor group 223A. The gates G1A and G2A extend in the channel width direction, and are aligned in the channel length direction. A transfer transistor WT1A includes the diffusion layer region SD and the gate G1A, and a transfer transistor WT2A includes the diffusion layer region SD and the gate G2A. That is, the two transfer transistors WT adjacent to each other in the channel length direction include two gates G1A and G2A disposed on one diffusion layer region SD. In other words, the two transfer transistors WT adjacent to each other in the channel length direction share one diffusion layer region SD.

One side (source) of each of the diffusion layer regions SD is electrically connected to one of the control gate lines CG (not illustrated) through the contacts CA. In addition, the other side (drain) of each of the diffusion layer regions SD is electrically connected to one of the word lines WL of the blocks BLKa. For example, each of wires 224A extending from the word lines WL0 to WL7 of the block BLK1 is electrically connected to one of drains of the transfer transistors WT2A on the diffusion layer regions SD01_0A to SD01_3A and drains of the transfer transistors WT1A on the diffusion layer regions SD23_0A to SD23_3A. A connection relationship of this type may be arbitrarily determined.

In the same manner, each of wires 224A extending from the word lines WL0 to WL7 of the block BLK3 is electrically connected to one of drains of the transfer transistors WT2A on the diffusion layer regions SD23_0A to SD23_3A and drains of the transfer transistors WT1A on the diffusion layer regions SD45_0A to SD45_3A.

The transfer transistor group 223B has the same configuration as the transfer transistor group 223A.

More specifically, the transfer transistor group 223B includes diffusion layer regions SD (SD01_0B to SD01_3B, SD23_0B to SD23_3B, and SD45_0B to SD45_3B). Gates G1B and G2B and contacts CB are respectively provided on the diffusion layer regions SD. The gates G1B and G2B extend in the channel width direction, and are aligned in the channel length direction. A transfer transistor WT1B includes the diffusion layer region SD and the gate G1B, and a transfer transistor WT2B includes the diffusion layer region SD and the gate G2B.

One side (source) of each of the diffusion layer regions SD in the transfer transistor group 223B is electrically connected to one of the control gate lines CG (not illustrated) through the contacts CB. In addition, the other side (drain) of each of the diffusion layer regions SD is electrically connected to one of the word lines WL of the blocks BLKb. For example, each of wires 224B extending from the word lines WL0 to WL7 of the block BLK2 is electrically connected to one of drains of the transfer transistors WT2B on the diffusion layer regions SD01_0B to SD01_3B and drains of the transfer transistors WT1B on the diffusion layer regions SD23_0B to SD23_3B. A connection relationship of this type may be arbitrarily determined.

In the same manner, each of wires 224B extending from the word lines WL0 to WL7 of the block BLK4 is electrically connected to one of drains of the transfer transistors WT2B on the diffusion layer regions SD23_0B to SD23_3B and drains of the transfer transistors WT1B on the diffusion layer regions SD45_0B to SD45_3B.

In addition, shield gates 226 are provided between the diffusion layer regions SD. A voltage of approximately 0 volt is applied to the shield gates 226. By doing so, a punch-through leakage current can be further prevented from flowing through the element isolation area.

In addition, it is preferable that a width of the element isolation area (for example, an element isolation area between the diffusion layer region SD01_3A and the diffusion layer region SD01_0B) between the transfer transistor group 223A and the transfer transistor group 223B is greater than those of other element isolation areas. For example, it is preferable that the width of the element isolation area between the transfer transistor group 223A and the transfer transistor group 223B is approximately 700 nm to 1.0 μm. Accordingly, it is possible to prevent the punch-through leakage current from flowing through the element isolation area between the transfer transistor group 223A and the transfer transistor group 223B. In addition, a guard ring (not illustrated) may be provided.

In addition, it is preferable that the transfer transistor WT has a higher breakdown voltage than the memory cell transistor MT. More specifically, it is preferable that a thickness of a gate insulating film of the transfer transistor WT is double that of a tunnel insulating film of the memory cell transistor MT or more, and is approximately 25 nm to 50 nm. This is for preventing the gate insulating film of the transfer transistor WT from breaking down, although a voltage of approximately 25 V is applied to a gate of the transfer transistor WT, in a state where a write voltage Vpgm and an erasure voltage Vera of the memory cell transistor MT are set to a voltage equal to or lower than 25 V.

Effects According to the First Embodiment

Figure 6:
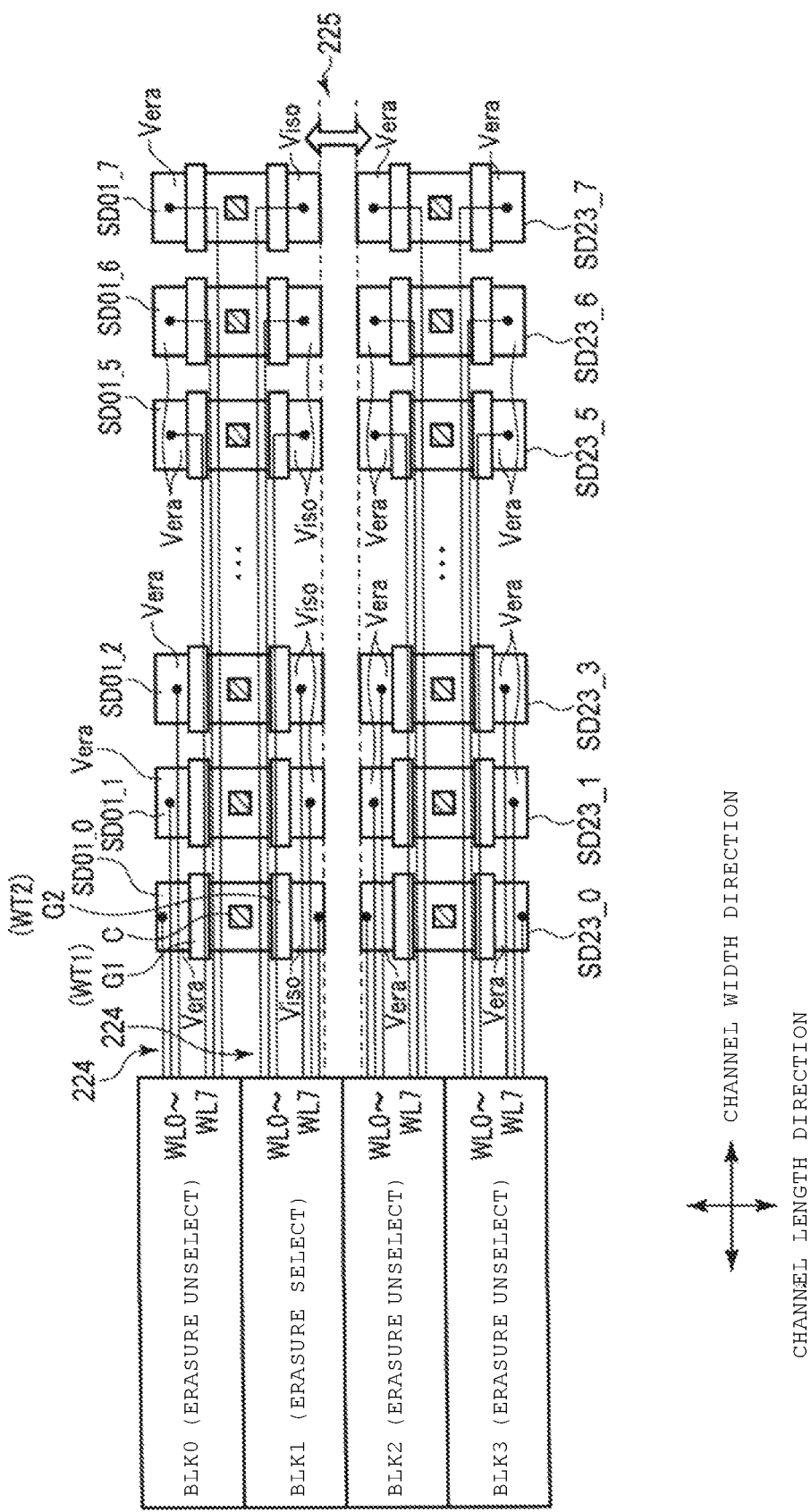
FIG. 6 is a layout diagram illustrating the row decoder of the semiconductor memory device according to a comparative example, and depicts voltages applied at the time of erasure operation.

As illustrated in FIG. 6, in a comparative example, diffusion layer regions SD01_0 to SD01_7 are aligned in the channel width direction, and the diffusion layer regions SD23_0 to SD23_7 are aligned in the channel width direction. In addition, each of the diffusion layer regions SD01_0 to SD01_7 and each of the diffusion layer regions SD23_0 to SD23_7 are aligned in the channel length direction. In addition, gates G1 and gates G2 which extend in the channel width direction are respectively provided on the diffusion layer regions SD01_0 to SD01_7 and the diffusion layer regions SD23_0 to SD23_7. Transfer transistors WT1 include the diffusion layer regions SD01_0 to SD01_7, the diffusion layer regions SD23_0 to SD23_7, and gates G1. Transfer transistors WT2 include the diffusion layer regions SD01_0 to SD01_7, the diffusion layer regions SD23_0 to SD23_7, and gates G2.

In the comparative example, wires 224 extending from word lines WL0 to WL7 of each block BLK are electrically connected to the transfer transistors WT which are aligned in the channel width direction. For example, the word lines WL0 to WL7 of the block BLK1 are electrically connected to the transfer transistors WT2 on the diffusion layer regions SD01_0 to SD01_7 which are aligned in the channel width direction. In addition, the word lines WL0 to WL7 of the block BLK2 are electrically connected to the transfer transistors WT1 on the diffusion layer regions SD23_0 to SD23_7 which are aligned in the channel width direction.

Thus, in the case where, in an erasure operation, the block BLK1 is an erasure select block, and the other blocks BLK are erasure unselect blocks, there is a large voltage difference between a channel and a gate (word line WL) of the memory cell transistor in the erasure select block (block BLK1), and thereby data are erased. Accordingly, a voltage VISO of, for example, approximately 0 V is applied to the word line WL from a control gate CG through a contact C and the transfer transistor WT2. Hence, the voltage VISO is applied to the transfer transistor WT2 on the diffusion layer regions SD01_0 to SD01_7 which are connected to the block BLK1.

Meanwhile, in the erasure unselect block (for example, block BLK2), there is no voltage difference between the channel and the gate of the memory cell transistor, and the data are retained. More specifically, the erasure voltage Vera is applied to the channel of the memory cell transistor, and the word line WL enters a floating state. For this reason, the erasure voltage Vera of a high voltage is applied to the word line WL and the transfer transistors WT1 connected to the word line WL by capacitance coupling between the channel of the memory cell transistor and the contact plug 35, and the word line WL. Hence, the erasure voltage Vera is applied to the transfer transistors WT1 on the diffusion layer region SD23_0 to SD23_7 connected to the block BLK2.

In this way, if there is a great voltage difference between the transfer transistors WT2 on the diffusion layer region SD01_0 to SD01_7 connected to the block BLK1 and the transfer transistors WT1 on the diffusion layer region SD23_0 to SD23_7 connected to the block BLK2, the punch-through leakage current flows through the element isolation area 225. As a result, the erasure fails. In order to solve this problem, if the element isolation area 225 is widened, the punch-through leakage current can be prevented from flowing, but a chip size is accordingly increased.

The same problem occurs even when a write operation is performed. In the write operation, in the case where the block BLK1 is a write select block, and the other blocks BLK are write unselect blocks, the write voltage Vpgm is applied to the transfer transistor WT2 which is any one write target on the diffusion layer region SD01_0 to SD01_7 connected to the block BLK1. Meanwhile, the transfer transistors WT1 which are non-write targets on the diffusion layer region SD23_0 to SD23_7 connected to the block BLK2 enters a floating state.

In this way, if there is a great voltage difference between the transfer transistors WT2 which are write targets on the diffusion layer region SD01_0 to SD01_7 connected to the block BLK1 and the transfer transistors WT1 which are non-write targets on the diffusion layer region SD23_0 to SD23_7 connected to the block BLK2, the punch-through leakage current flows through the element isolation area 225. As a result, the write voltage Vpgm does not sufficiently increase to an expected voltage, and thus, the writing fails.

In contrast to this, according to the first embodiment, transfer transistor groups 223A and 223B are provided. In addition, wires 224A extending from the word lines WL0 to WL7 of the blocks BLKa (blocks BLK1, BLK3, and BLK5) are electrically connected to the transfer transistors WT in the transfer transistor group 223A. For example, the wires 224A extending from the word lines WL0 to WL7 of the block BLK1 are electrically connected to transfer transistors WT2A on diffusion layer region SD01_0A to SD01_3A and transfer transistors WT1A on diffusion layer region SD23_0A to SD23_3A of the transfer transistor group 223A. Meanwhile, wires 224B extending from the word lines WL0 to WL7 of the blocks BLKb (blocks BLK0, BLK2, and BLK4) are electrically connected to the transfer transistors WT in the transfer transistor group 223B. For example, the wires 224B extending from the word lines WL0 to WL7 of the block BLK1 are electrically connected to transfer transistors WT2B on diffusion layer region SD01_0B to SD01_3B and transfer transistors WT1B on diffusion layer region SD23_0B to SD23_3B of the transfer transistor group 223B.

Figure 7:
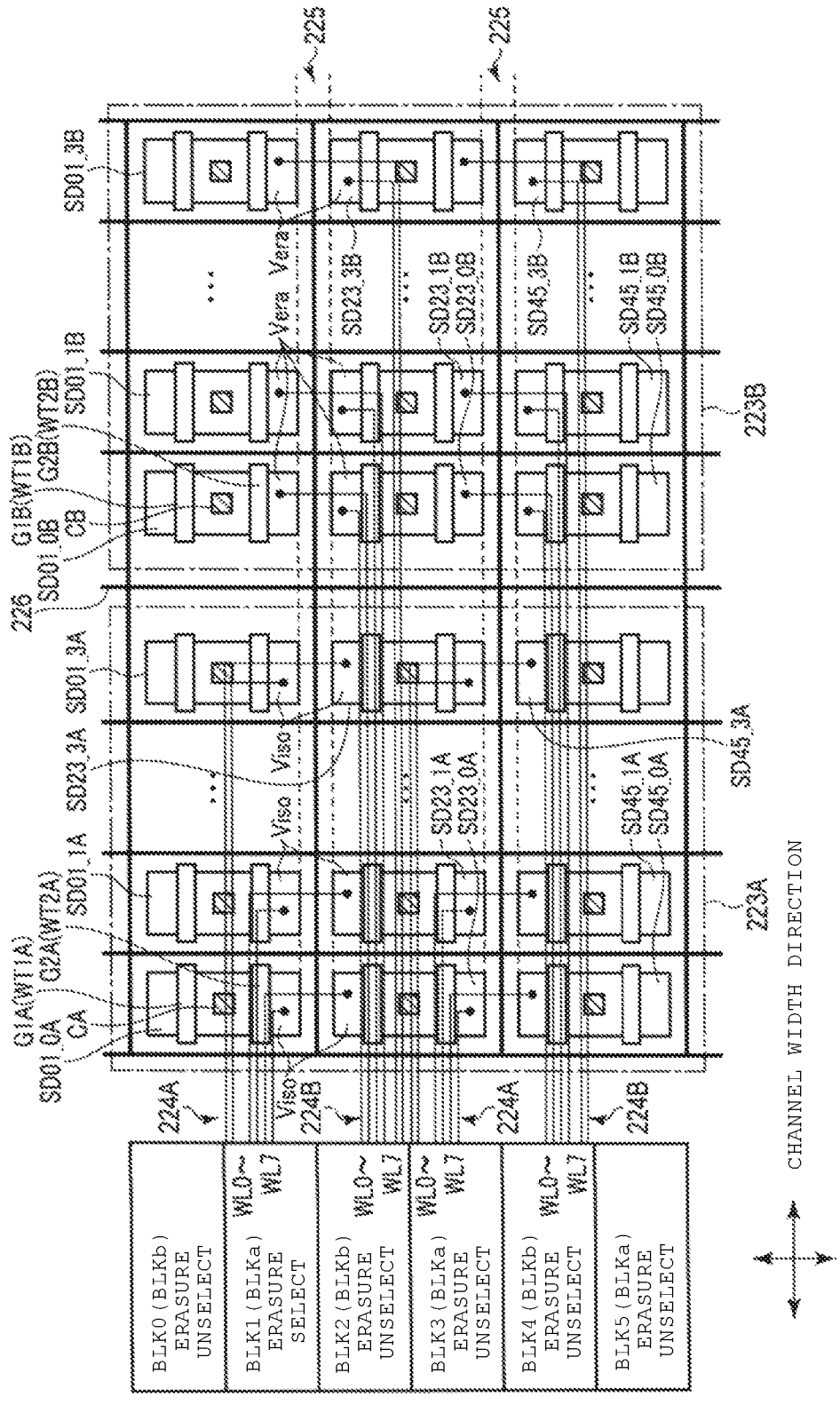
FIG. 7 is a layout diagram illustrating the row decoder of the semiconductor memory device according to the first embodiment, and depicts voltages applied at the time of erasure operation.

Here, as illustrated in FIG. 7, in the case where, in the erasure operation, the block BLK1 is an erasure select block, and the other blocks BLK are erasure unselect blocks, the voltage VISO is applied to the transfer transistor WT2A on the diffusion layer regions SD01_0A to SD01_3A in the transfer transistor group 223A, and the transfer transistor WT1A on the diffusion layer regions SD23_0A to SD23_3A. Meanwhile, the voltage Vera is applied to the transfer transistor WT2B on the diffusion layer regions SD01_0B to SD01_3B in the transfer transistor group 223B, and the transfer transistor WT1B on the diffusion layer regions SD23_0B to SD23_3B.

Accordingly, the same voltage is applied to the transfer transistors WT2A on the diffusion layer region SD01_0A to SD01_3A and the transfer transistors WT1A on the diffusion layer region SD23_0A to SD23_3A, which interpose the element isolation area 225, and there is no voltage difference. In addition, the same voltage is applied to the transfer transistors WT2B on the diffusion layer region SD01_0B to SD01_3B and the transfer transistors WT1B on the diffusion layer region SD23_0B to SD23_3B, which interpose the element isolation area 225, and there is no voltage difference. Accordingly, the punch-through current does not flow through the element isolation area 225. Hence, a chip size is not increased, and it is possible to prevent the erasure from failing.

In addition, in the write operation, the write voltage Vpgm is applied to any one (a transistor which is a write target) of the transfer transistors WT2A on the diffusion layer region SD01_0A to SD01_3A and the transfer transistors WT1A on the diffusion layer region SD23_0A to SD23_3A, which interpose the element isolation area 225, and a predetermined voltage is applied to the other transfer transistors. The predetermined voltage is a voltage to the extent that the punch-through current does not flow through the element isolation area 225, for example, approximately 2.0 V, although being adjacent to the write voltage Vpgm and the element isolation area 225 is interposed. In addition, the transfer transistors WT2B on the diffusion layer region SD01_0B to SD01_3B and the transfer transistors WT1B (transistor which is a non-write target) on the diffusion layer region SD23_0B to SD23_3B, which interpose the element isolation area 225, enter a floating state. Accordingly, the large punch-through current does not flow through the element isolation area 225. Hence, the chip size is not increased, and it is possible to prevent writing from failing.

Modification Example According to First Embodiment

Figure 8:
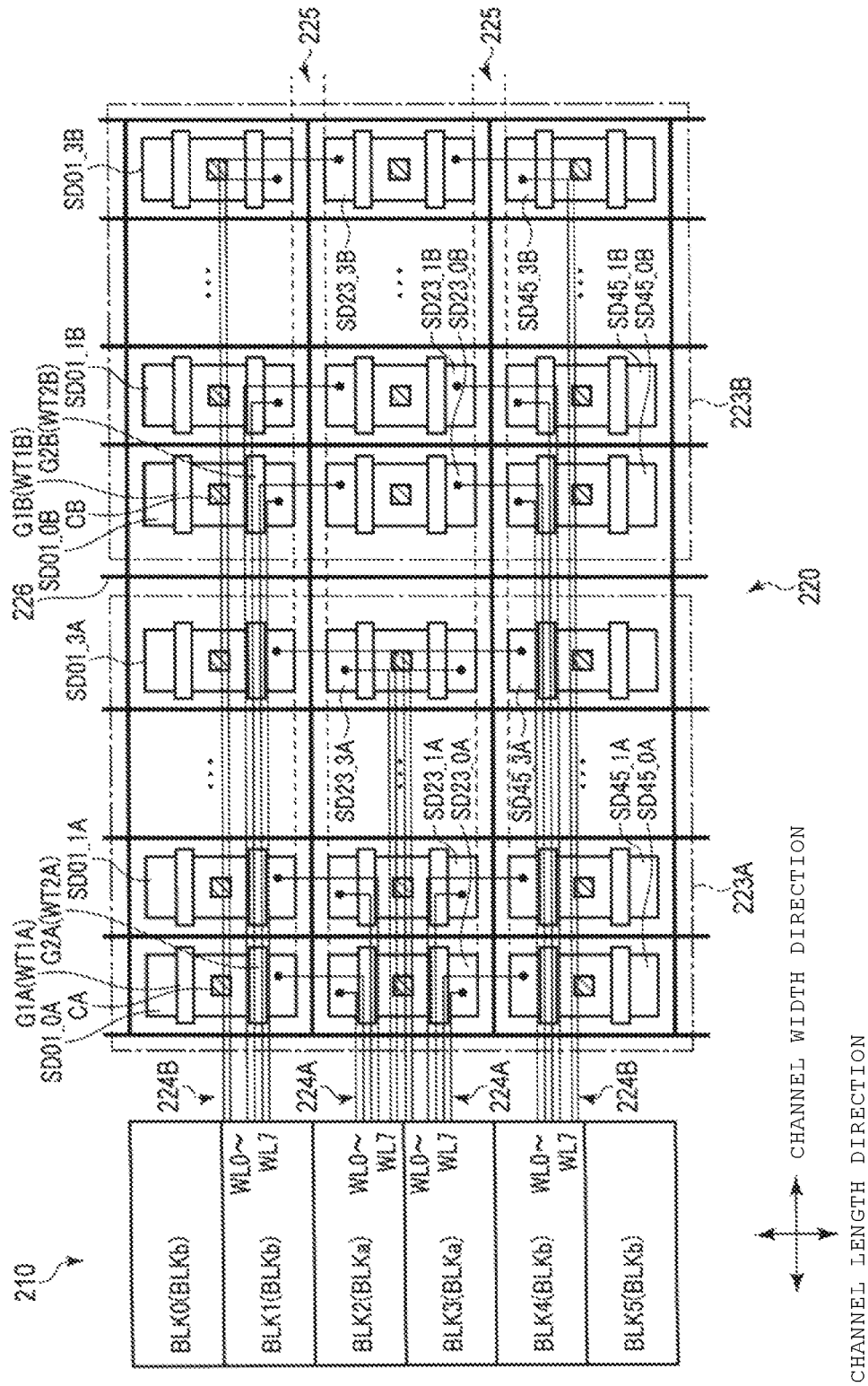
FIG. 8 is a layout diagram illustrating a modification example of the row decoder of the semiconductor memory device according to the first embodiment.

FIG. 8 is a layout diagram illustrating a modification example of the row decoder of the semiconductor memory device according to the first embodiment.

In the first embodiment, the blocks BLKa correspond to the blocks BLK1, BLK3, and BLK5, and the wires 224A extending from the word lines WL0 to WL7 are electrically connected to the transfer transistors WT in the transfer transistor group 223A. Meanwhile, the blocks BLKb correspond to the blocks BLK0, BLK2, and BLK4, and the wires 224B extending from the word lines WL0 to WL7 are electrically connected to the transfer transistors WT in the transfer transistor group 223B. That is, the blocks BLKa and the blocks BLKb alternate for each block.

In contrast to this, in a modification example, the blocks BLKa and the blocks BLKb alternate every two blocks.

More specifically, as illustrated in FIG. 8, the blocks BLKa correspond to the blocks BLK2 and BLK3, and the blocks BLKb correspond to the blocks BLK0, BLK1, BLK4, and BLK5. The transfer transistor group 223A connects each of the word lines WL0 to WL7 of the blocks BLKa (blocks BLK2 and BLK3) to each of the control gate lines CG0 to CG7. Meanwhile, the transfer transistor group 223B connects each of the word lines WL0 to WL7 of the blocks BLKb (blocks BLK0, BLK1, BLK4, and BLK5) to each of the control gate lines CG0 to CG7.

For example, each of the wires 224A extending from the word lines WL0 to WL7 of the block BLK2 is electrically connected to one of drains of the transfer transistors WT2A on the diffusion layer region SD01_0A to SD01_3A and drains of the transfer transistors WT1A on the diffusion layer region SD23_0A to SD23_3A.

In the same manner, each of the wires 224A extending from the word lines WL0 to WL7 of the block BLK3 is electrically connected to one of drains of the transfer transistors WT2A on the diffusion layer region SD23_0A to SD23_3A and drains of the transfer transistors WT1A on the diffusion layer region SD45_0A to SD45_3A.

In addition, each of the wires 224B extending from the word lines WL0 to WL7 of the block BLK1 is electrically connected to one of drains of the transfer transistors WT2B on the diffusion layer region SD01_0B to SD01_3B and drains of the transfer transistors WT1B on the diffusion layer region SD23_0B to SD23_3B.

In the same manner, each of the wires 224B extending from the word lines WL0 to WL7 of the block BLK4 is electrically connected to one of drains of the transfer transistors WT2B on the diffusion layer region SD23_0B to SD23_3B and drains of the transfer transistors WT1B on the diffusion layer region SD45_0B to SD45_3B.

Second Embodiment

Hereinafter, a semiconductor memory device according to a second embodiment will be described with reference to FIG. 9. In the second embodiment, the same features as in the first embodiment will not be described, and different features from the first embodiment will be primarily described.

Configuration Example of Row Decoder According to Second Embodiment

Figure 9:
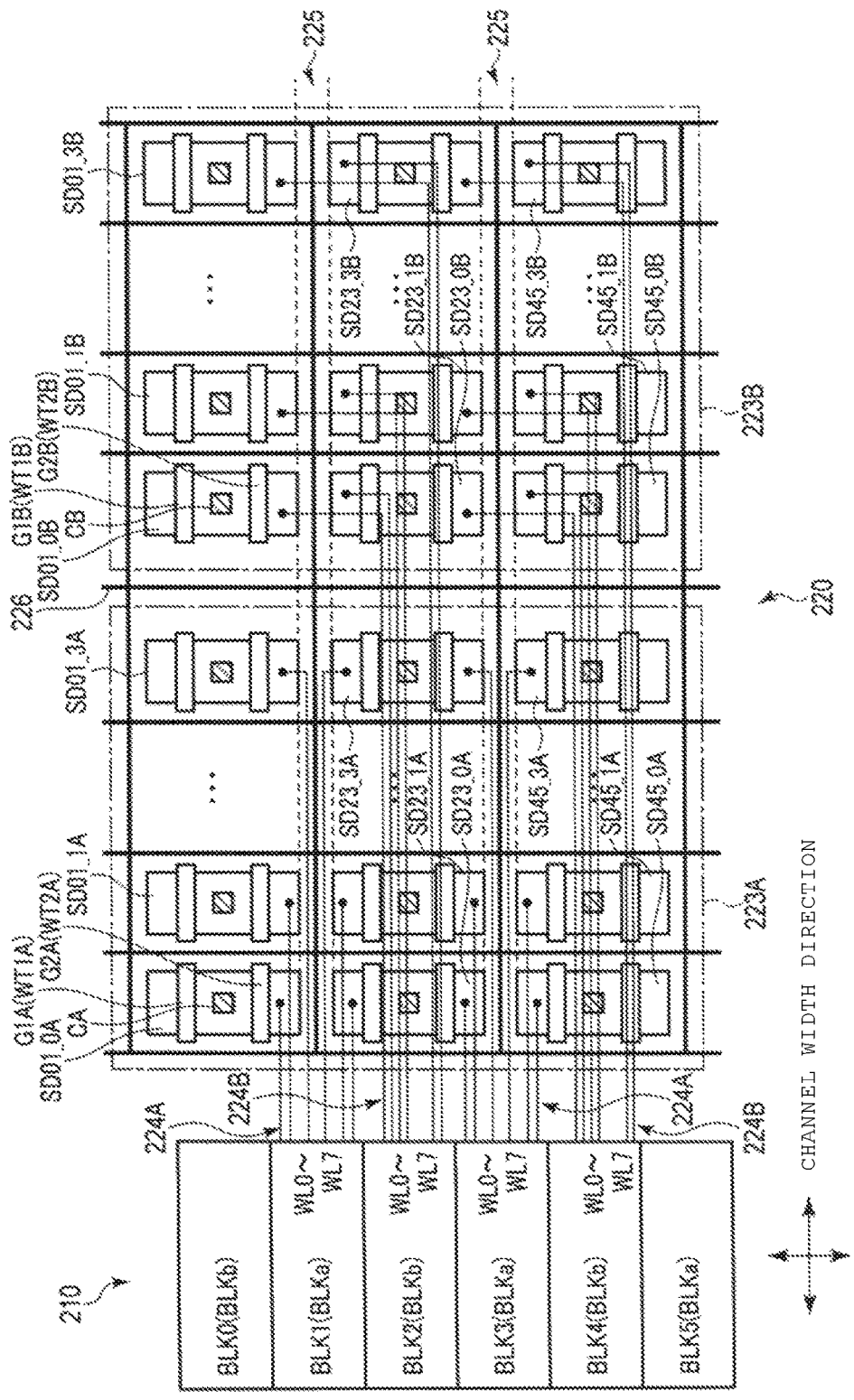
FIG. 9 is a layout diagram illustrating the row decoder of the semiconductor memory device according to a second embodiment.

As illustrated in FIG. 9, in the second embodiment, a feature different from the first embodiment is that the transfer transistor groups 223A and 223B are shifted in a channel length direction by a half block. Here, the transfer transistor groups 223A and 223B are shifted in an upper direction of the figure by a half block.

More specifically, lower ends of the diffusion layer region SD01_0A to SD01_3A in the channel length direction are located in the vicinity of the center of the block BLK1. In addition, upper ends of the diffusion layer regions SD23_0A to SD23_3A in the channel length direction are located in the vicinity of the center of the block BLK1, and lower ends of the diffusion layer regions SD23_0A to SD23_3A in the channel length direction are located in the vicinity of the center of the block BLK3. In addition, upper ends of the diffusion layer regions SD45_0A to SD45_3A in the channel length direction are located in the vicinity of the center of the block BLK3, and lower ends of the diffusion layer regions SD45_0A to SD45_3A in the channel length direction are located in the vicinity of the center of the block BLK5.

That is, the element isolation area 225 between the diffusion layer region SD01_0A to SD01_3A and the diffusion layer region SD23_0A to SD23_3A is located in the vicinity of the center of the block BLK1 in the channel length direction. In addition, the element isolation area 225 between the diffusion layer region SD23_0A to SD23_3A and the diffusion layer region SD45_0A to SD45_3A is located in the vicinity of the center of the block BLK3 in the channel length direction.

For this reason, word line contacts (connection terminals between the transfer transistors WT2A and the extending wires 224A) of the transfer transistors WT2A on the diffusion layer region SD01_0A to SD01_3A, and word line contacts (connection terminals between the transfer transistors WT1A and the extending wires 224A) of the transfer transistors WT1A on the diffusion layer region SD23_0A to SD23_3A are located within a width of the block BLK1 in the channel length direction. In the same manner, word line contacts of the transfer transistors WT2A on the diffusion layer region SD23_0A to SD23_3A, and word line contacts of the transfer transistors WT1A on the diffusion layer region SD45_0A to SD45_3A are located within a width of the block BLK3 in the channel length direction.

Effects According to the Second Embodiment

In the first embodiment, the transfer transistors WT are arranged such that the location of the element isolation area 225 in the channel length direction corresponds to a boundary between the blocks BLK. In this case, it is required that the wires 224A extending from the word lines WL of the blocks BLKa are connected to the word line WL contacts of the transfer transistors WT within the width of the blocks BLKb in the channel length direction. That is, the word line contacts of the transfer transistors WT connected to the extending word wires 224A are located at different places from the blocks BLKa in the channel length direction. For example, the wires 224A extending from the word line WL of the block BLK1 are connected to the word line WL contacts of the transfer transistors WT on the diffusion layer region SD23_0A to SD23_3A. For this reason, not only wires in the channel width direction but also wires in channel length direction are required as the extending wires 224A. As a result, the wires in the channel length direction of the extending wires 224A are located within the width of the blocks BLKb in the channel length direction. Accordingly, the wires 224B extending from the word line WL of the blocks BLKb are disturbed, and thus, there is a limitation on the number of the extending wires.

In contrast to this, in the second embodiment, the transfer transistor groups 223A and 223B are shifted in the channel length direction by a half block. Due to this, the word line contacts of the transfer transistors WT which are connected are located within the width of the blocks BLKa in the channel length direction. For example, the word line contacts of the transfer transistors WT2A on the diffusion layer region SD01_0A to SD01_3A and the word line contacts of the transfer transistors WT1A on the diffusion layer region SD23_0A to SD23_3A are located within the width of the block BLK1 in the channel length direction. For this reason, the wire in the channel length direction is not required and a connection can be made only by wire in the channel width direction, as the extending wires 224A. Hence, the extending wires 224A are not located within the width of the blocks BLKb in the channel length direction. As a result, the extending wires 224A do not disturb the extending wires 224B, and thus, there is no limitation on the number of the extending wires 224B.

Third Embodiment

Hereinafter, a semiconductor memory device according to a third embodiment will be described with reference to FIG. 10. In the third embodiment, the same features as in the first embodiment will not be described, and different features from the first embodiment will be primarily described.

Configuration Example of Row Decoder According to Third Embodiment

Figure 10:
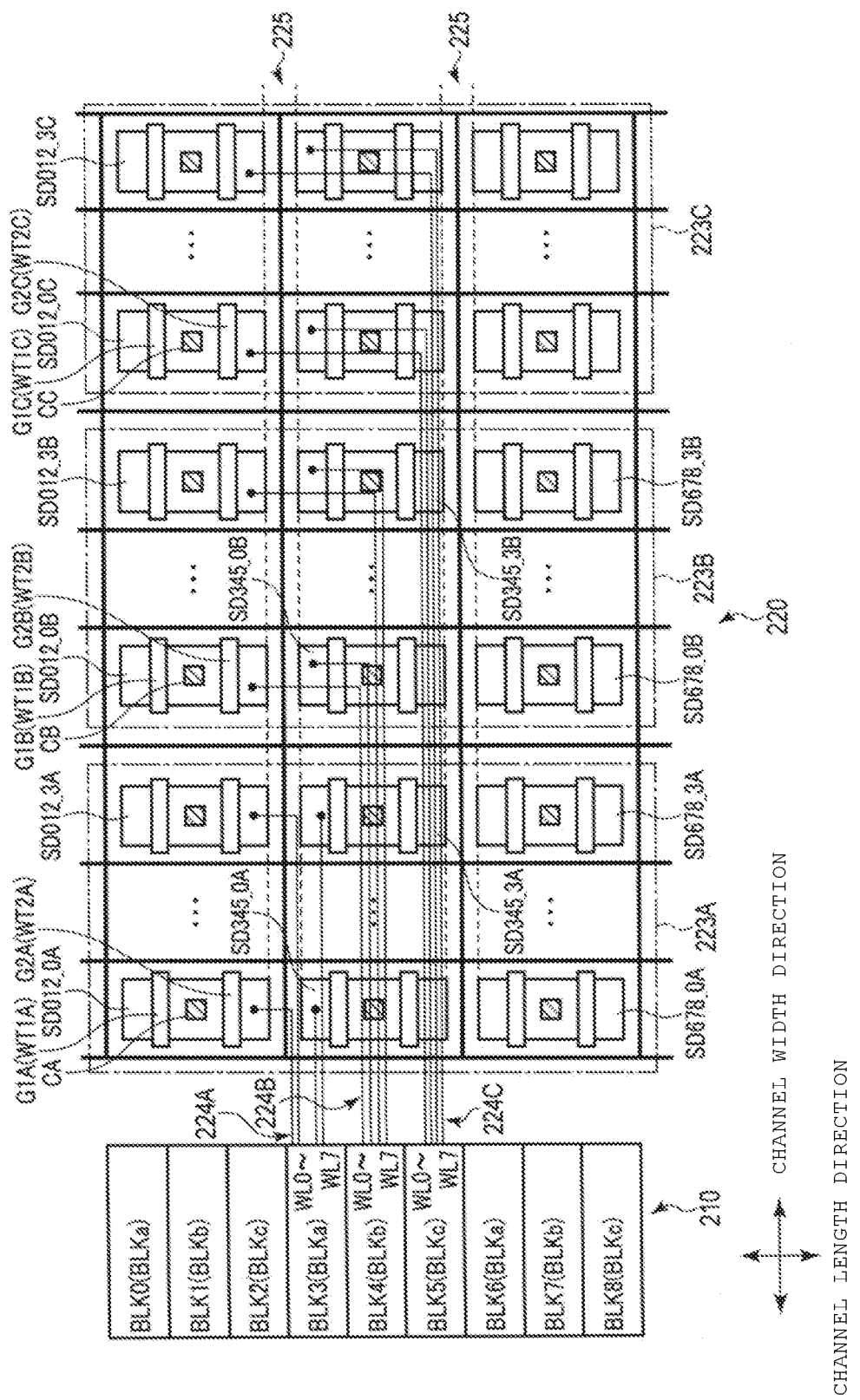
FIG. 10 is a layout diagram illustrating a row decoder of a semiconductor memory device according to a third embodiment.

As illustrated in FIG. 10, the third embodiment is different from the first embodiment in that the third embodiment has a two-transistor/three-block configuration, not a two-transistor/two-block configuration. In addition, the third embodiment includes three transistor groups 223A, 223B, and 223C.

More specifically, the row decoder 220 includes the transfer transistor group 223A for blocks BLKa (blocks BLK0, BLK3, and BLK6), the transfer transistor group 223B for blocks BLKb (blocks BLK1, BLK4, and BLK7), and the transfer transistor group 223C for blocks BLKc (blocks BLK2, BLK5, and BLK8). The transfer transistor group 223A is provided adjacent to the memory cell array 210 in the channel width direction. The transfer transistor group 223B is provided adjacent to the transfer transistor group 223A in the channel width direction. The transfer transistor group 223C is provided adjacent to the transfer transistor group 223B.

The transfer transistor group 223A connects each of the word lines WL0 to WL7 of the blocks BLKa (blocks BLK0, BLK3, and BLK6) to each of the control gate lines CG0 to CG7. In addition, the transfer transistor group 223B connects each of the word lines WL0 to WL7 of the blocks BLKb (blocks BLK1, BLK4, and BLK7) to each of the control gate lines CG0 to CG7. Furthermore, the transfer transistor group 223C connects each of the word lines WL0 to WL7 of the blocks BLKc (blocks BLK2, BLK5, and BLK8) to each of the control gate lines CG0 to CG7.

The transfer transistor group 223A includes diffusion layer regions SD (SD012_0A to SD012_3A, SD345_0A to SD345_3A, and SD678_0A to SD678_3A). Dimensions of the diffusion layer regions SD012_0A to SD012_3A in the channel length direction correspond to three blocks. Upper ends of the diffusion layer regions SD012_0A to SD012_3A in the channel length direction are located in the vicinity of an upper end of the block BLK0, and lower ends of the diffusion layer regions SD012_0A to SD012_3A in the channel length direction are located in the vicinity of a lower end of the block BLK2.

In the same manner, upper ends of the diffusion layer regions SD345_0A to SD345_3A in the channel length direction are located in the vicinity of an upper end of the block BLK3, and lower ends of the diffusion layer regions SD345_0A to SD345_3A in the channel length direction are located in the vicinity of a lower end of the block BLK5. In addition, upper ends of the diffusion layer regions SD678_0A to SD678_3A in the channel length direction are located in the vicinity of an upper end of the block BLK6, and lower ends of the diffusion layer regions SD678_0A to SD678_3A in the channel length direction are located in the vicinity of a lower end of the block BLK8.

One side (source) of each of the diffusion layer regions SD in the transfer transistor group 223A is electrically connected to one of the control gate lines CG (not illustrated) through the contacts CA. In addition, the other side (drain) of each of the diffusion layer regions SD is electrically connected to one of the word lines WL of the blocks BLKa. For example, each of the wires 224A extending from the word lines WL0 to WL7 of the block BLK3 is electrically connected to one of drains of the transfer transistors WT2A on the diffusion layer regions SD012_0A to SD012_3A and drains of the transfer transistors WT1A on the diffusion layer regions SD345_0A to SD345_3A.

The transfer transistor groups 223B and 223C have the same configuration as the transfer transistor group 223A.

More specifically, the transfer transistor group 223B includes diffusion layer regions SD (SD012_0B to SD012_3B, SD345_0B to SD345_3B, and SD678_0B to SD678_3B). Gates G1B and G2B and contacts CB are respectively provided on the diffusion layer regions SD. The gates G1B and G2B extend in the channel width direction, and are aligned in the channel length direction. A transfer transistor WT1B includes the diffusion layer region SD and the gate G1B, and a transfer transistor WT2B includes the diffusion layer region SD and the gate G2B.

One side (source) of each of the diffusion layer regions SD in the transfer transistor group 223B is electrically connected to one of the control gate lines CG (not illustrated) through the contacts CB. In addition, the other side (drain) of each of the diffusion layer regions SD is electrically connected to one of the word lines WL of the blocks BLKb. For example, each of the wires 224B extending from the word lines WL0 to WL7 of the block BLK5 is electrically connected to one of drains of the transfer transistors WT2B on the diffusion layer regions SD012_0B to SD012_3B and drains of the transfer transistors WT1B on the diffusion layer regions SD345_0B to SD345_3B.

In addition, the transfer transistor group 223C includes diffusion layer regions SD (SD012_0C to SD012_3C, SD345_0C to SD345_3C, and SD678_0C to SD678_3C). Gates G1C and G2C and contacts CC are respectively provided on the diffusion layer regions SD. The gates G1C and G2C extend in the channel width direction, and are aligned in the channel length direction. A transfer transistor WT1C includes the diffusion layer region SD and the gate G1C, and a transfer transistor WT2C includes the diffusion layer region SD and the gate G2C.

One side (source) of each of the diffusion layer regions SD in the transfer transistor group 223C is electrically connected to one of the control gate lines CG (not illustrated) through the contacts CC. In addition, the other side (drain) of each of the diffusion layer regions SD is electrically connected to one of the word lines WL of the blocks BLKc. For example, each of the wires 224C extending from the word lines WL0 to WL7 of the block BLK5 is electrically connected to one of drains of the transfer transistors WT2C on the diffusion layer regions SD012_0C to SD012_3C and drains of the transfer transistors WT1C on the diffusion layer regions SD345_0C to SD345_3C.

Effects According to the Third Embodiment

According to the third embodiment, a two-transistor/three-block configuration is provided, and the transfer transistor groups 223A, 223B, and 223C are provided. In addition, the wires 224A extending from the word lines WL0 to WL7 of the blocks BLKa (blocks BLK0, BLK3, and BLK6) are electrically connected to the transfer transistors WT in the transfer transistor group 223A. In addition, the wires 224B extending from the word lines WL0 to WL7 of the blocks BLKb (blocks BLK1, BLK4, and BLK7) are electrically connected to the transfer transistors WT in the transfer transistor group 223B. Furthermore, the wires 224C extending from the word lines WL0 to WL7 of the blocks BLKc (blocks BLK2, BLK5, and BLK8) are electrically connected to the transfer transistors WT in the transfer transistor group 223C. In this way, it is possible to obtain the same effect as in the first embodiment.

Fourth Embodiment

Hereinafter, a semiconductor memory device according to a fourth embodiment will be described with reference to FIG. 11. In the fourth embodiment, the same features as in the first embodiment will not be described, and different features from the first embodiment will be primarily described.

Configuration Example of Row Decoder According to Fourth Embodiment

Figure 11:
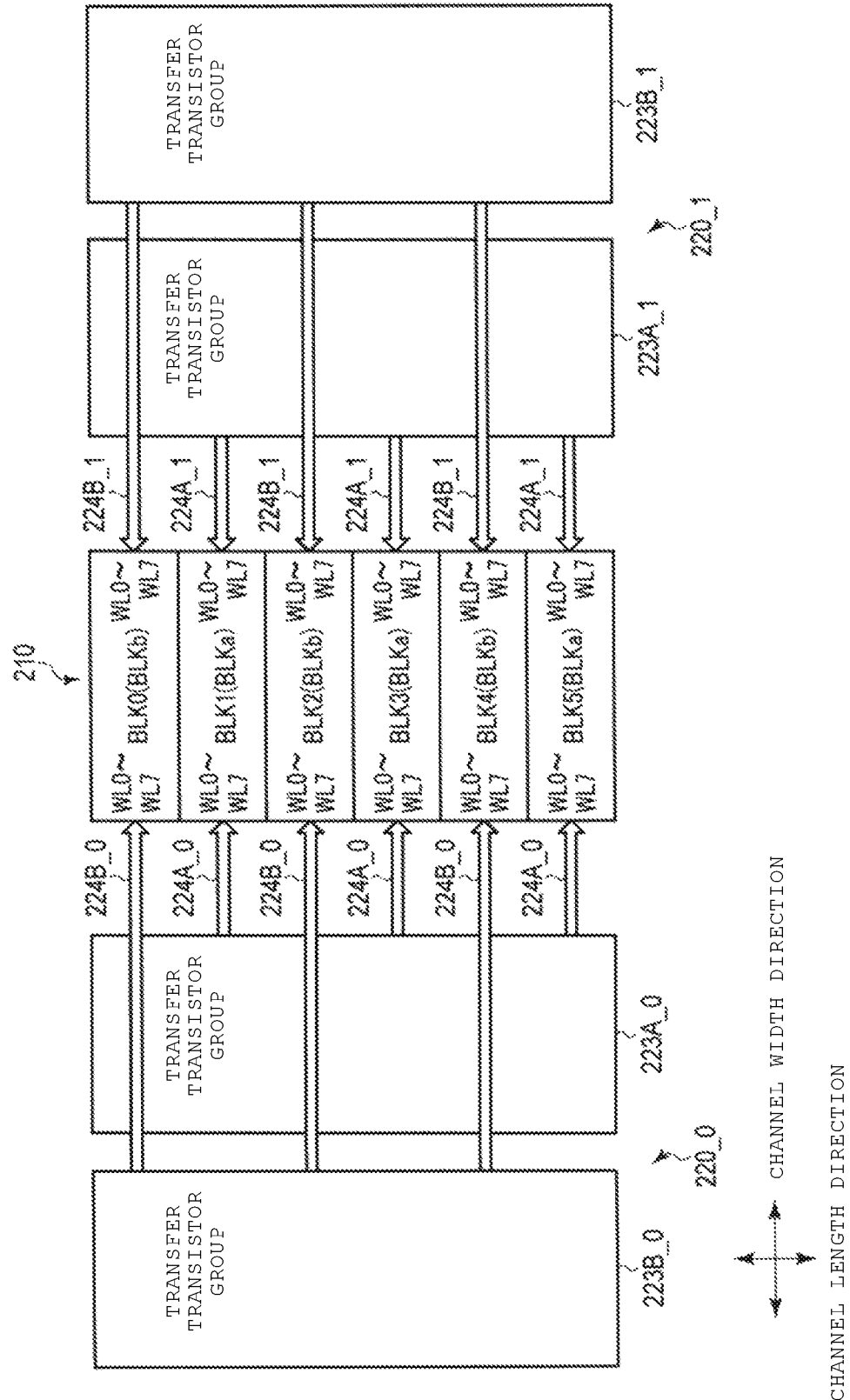
FIG. 11 is a layout diagram illustrating a row decoder of a semiconductor memory device according to a fourth embodiment.

As illustrated in FIG. 11, in the fourth embodiment, a row decoder 220_0 is arranged on one side of the memory cell array 210, and a row decoder 220_1 is arranged on the other side.

The row decoder 220_0 includes a transfer transistor group 223A_0 for the blocks BLKa (blocks BLK1, BLK3, and BLK5) and a transfer transistor group 223B_0 for the blocks BLKb (blocks BLK0, BLK2, and BLK4).

The transfer transistor group 223A_0 is provided adjacent to the memory cell array 210 in the channel width direction. The transfer transistor group 223B_0 is provided adjacent to the transfer transistor group 223A_0 in the channel width direction. The transfer transistor group 223A_0 is arranged between the memory cell array 210 and the transfer transistor group 223B_0 in the channel width direction.

One side of the transfer transistor group 223A_0 connects each of wires 224A_0 extending from the word lines WL0 to WL7 of the blocks BLKa (blocks BLK1, BLK3, and BLK5) to each of the control gate lines CG0 to CG7. Meanwhile, one side of the transfer transistor group 223B_0 connects each of wires 224B_0 extending from the word lines WL0 to WL7 of the blocks BLKb (blocks BLK0, BLK2, and BLK4) to each of the control gate lines CG0 to CG7.

The row decoder 220_1 includes a transfer transistor group 223A_1 for the blocks BLKa (blocks BLK1, BLK3, and BLK5) and a transfer transistor group 223B_1 for the blocks BLKb (blocks BLK0, BLK2, and BLK4).

The transfer transistor group 223A_1 is provided adjacent to the memory cell array 210 in the channel width direction. The transfer transistor group 223B_1 is provided adjacent to the transfer transistor group 223A_1 in the channel width direction. The transfer transistor group 223A_1 is arranged between the memory cell array 210 and the transfer transistor group 223B_1 in the channel width direction.

The other side of the transfer transistor group 223A_1 connects each of wires 224A_1 extending from the word lines WL0 to WL7 of the blocks BLKa (blocks BLK1, BLK3, and BLK5) to each of the control gate lines CG0 to CG7. Meanwhile, the other side of the transfer transistor group 223B_1 connects each of wires 224B_1 extending from the word lines WL0 to WL7 of the blocks BLKb (blocks BLK0, BLK2, and BLK4) to each of the control gate lines CG0 to CG7.

That is, the transfer transistor groups 223A_0 and 223B_0 and the transfer transistor groups 223A_1 and 223B_1 have mirror symmetry with respect to the memory cell array 210.

Configurations of the transfer transistor group 223A_0, 223B_0, 223A_1, and 223B_1 are the same as in the first embodiment, and descriptions thereof will be omitted.

Effects According to the Fourth Embodiment

According to the fourth embodiment, the row decoder 220_0 is arranged on one side of the memory cell array 210, and the row decoder 220_1 is arranged on the other side of the memory cell array 210. The row decoder 220_0 includes the transfer transistor group 223A_0 for the blocks BLKa (blocks BLK1, BLK3, and BLK5) and the transfer transistor group 223B_0 for the blocks BLKb (blocks BLK0, BLK2, and BLK4). The row decoder 220_1 includes the transfer transistor group 223A_1 for the blocks BLKa (blocks BLK1, BLK3, and BLK5) and the transfer transistor group 223B_1 for the blocks BLKb (blocks BLK0, BLK2, and BLK4). That is, voltages are applied to both sides of the word lines WL of each of the blocks BLK. Accordingly, it is possible to further reduce voltage boosting time and voltage dropping time of the word line, compared to a case where a voltage is applied to one side of the word line WL from the row decoder 220.

In the fourth embodiment, an example in which transfer transistor groups are provided on both sides of the memory cell array 210 and voltages are applied to both sides of the entire word lines WL of the entire blocks BLK is described, but the invention is not limited to this.

Figure 12:
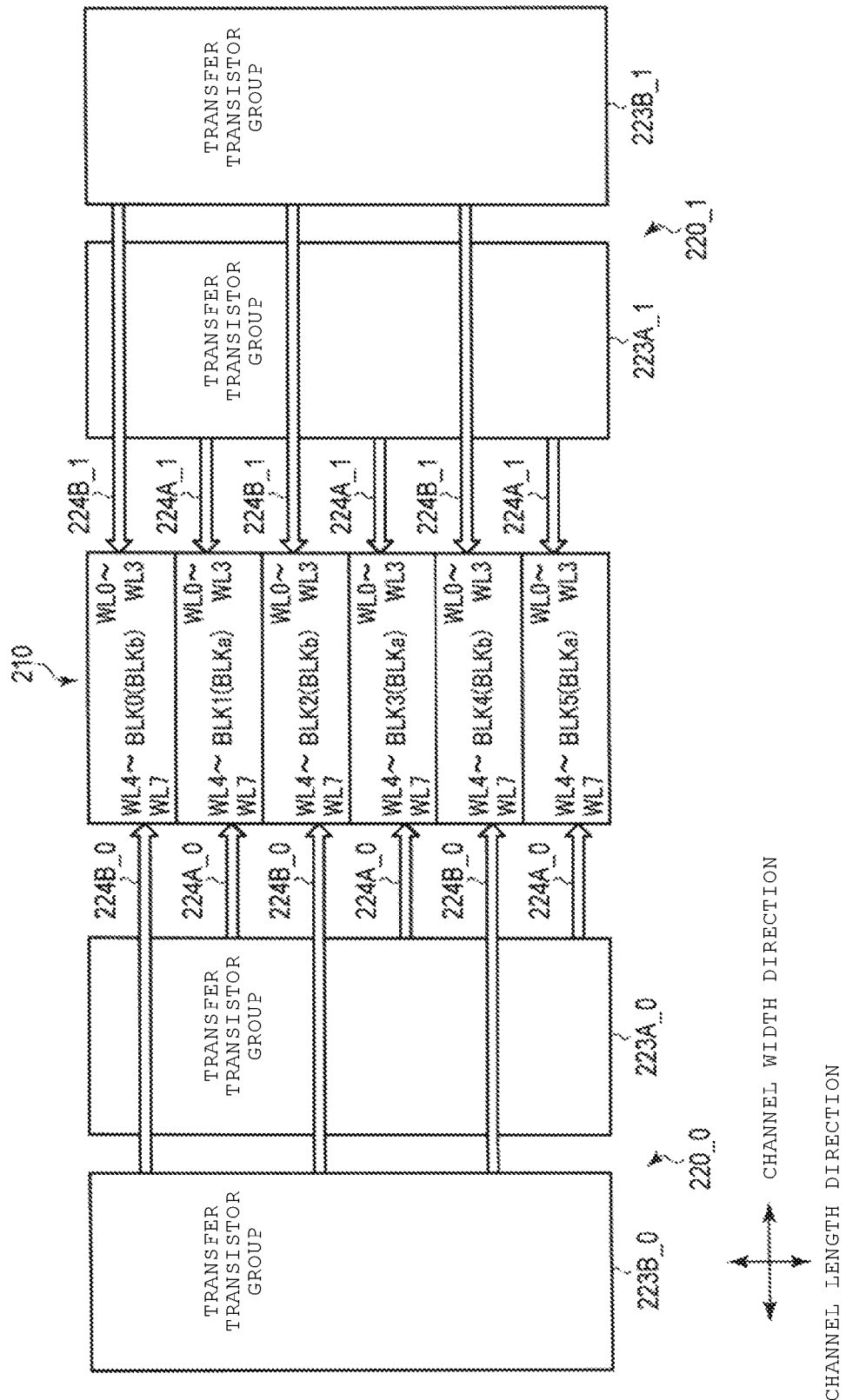
FIG. 12 is a layout diagram illustrating a modification example of the row decoder of the semiconductor memory device according to the fourth embodiment.

For example, as illustrated in FIG. 12, voltages may be applied to only one sides of the word lines WL4 to WL7 of each of the blocks BLK, and voltages may be applied to only the other sides of the word lines WL0 to WL3 of each of the blocks BLK. That is, the transfer transistor group 223A_0 is connected to the one sides of the word lines WL4 to WL7 of the blocks BLKa through the extending wires 224A_0, and the transfer transistor group 223A_1 is connected to the other sides of the word lines WL0 to WL3 of the blocks BLKa through the extending wires 224A_1. Meanwhile, the transfer transistor group 223B_0 is connected to one sides of the word lines WL4 to WL7 of the blocks BLKb through the extending wires 224B_0, and the transfer transistor group 223B_1 is connected to the other sides of the word lines WL0 to WL3 of the blocks BLKb through the extending wires 224B_1.

In addition, as illustrated in FIG. 13, voltages may be applied to only one sides of the word lines WL0 to WL7 of the blocks BLKa, and voltages may be applied to only the other sides of the word lines WL0 to WL7 of the blocks BLKb. That is, the transfer transistor group 223A is connected to the one sides of the word lines WL0 to WL7 of the blocks BLKa through the extending wires 224A. Meanwhile, the transfer transistor group 223B is connected to the other sides of the word lines WL0 to WL7 of the blocks BLKb through the extending wires 224B.

Fifth Embodiment

Hereinafter, a semiconductor memory device according to a fifth embodiment will be described with reference to FIG. 14. The fifth embodiment is a modification example of the fourth embodiment. In the fifth embodiment, the same features as in the fourth embodiment will not be described, and different features from the fourth embodiment will be primarily described.

Configuration Example of Row Decoder According to Fifth Embodiment

Figure 14:
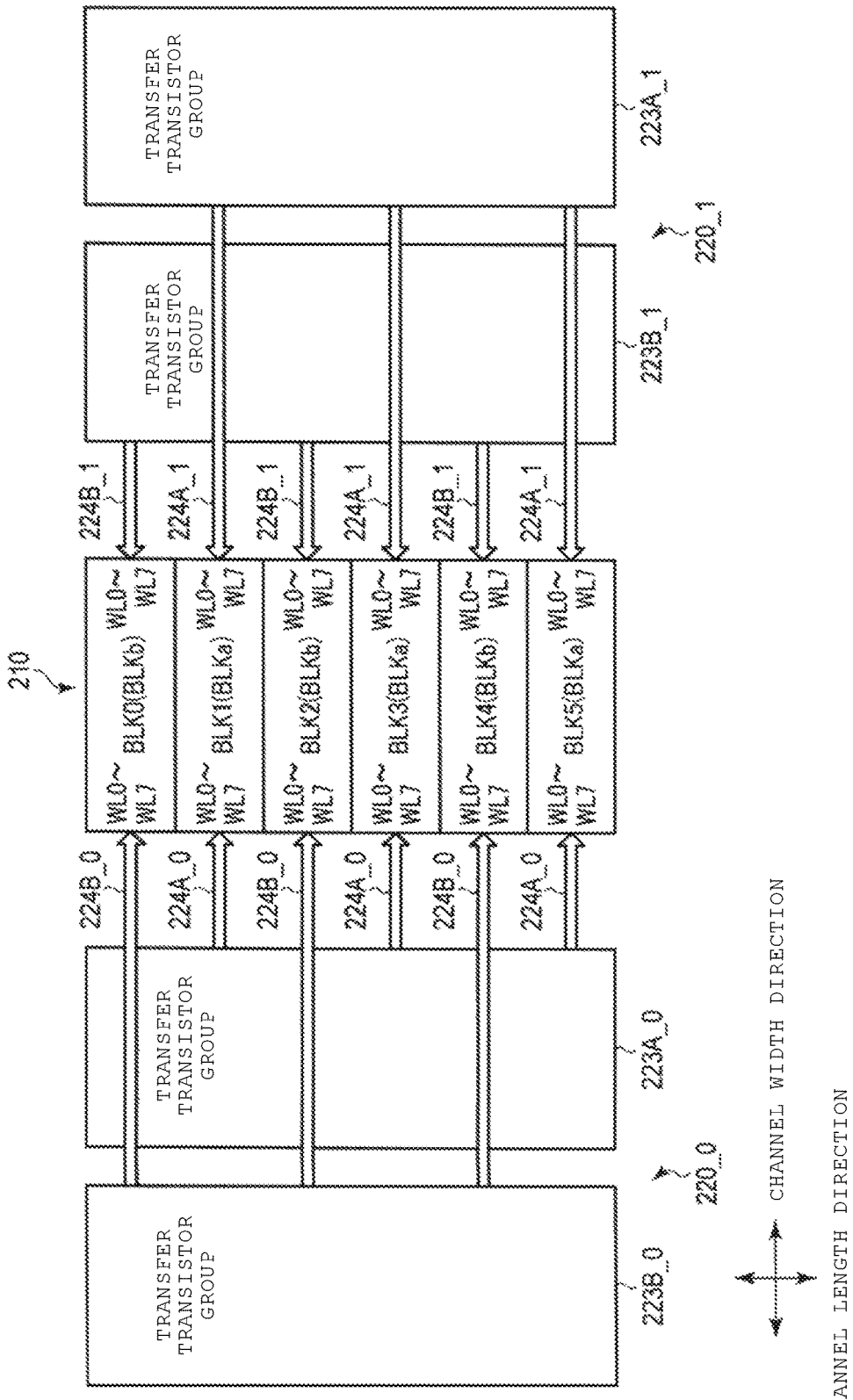
FIG. 14 is a layout diagram illustrating a row decoder of a semiconductor memory device according to a fifth embodiment.

As illustrated in FIG. 14, in the fifth embodiment, a configuration of a row decoder 220_1 is different from that of the fourth embodiment. More specifically, the transfer transistor group 223B_1 is provided adjacent to the memory cell array 210 in the channel width direction. The transfer transistor group 223A_1 is provided adjacent to the transfer transistor group 223B_1 in the channel width direction. The transfer transistor group 223B_1 is arranged between the memory cell array 210 and the transfer transistor group 223A_1 in the channel width direction.

That is, in the fifth embodiment, a positional relationship between the transfer transistor groups 223A_1 and 223B_1 is opposite to that of the fourth embodiment. In other words, the transfer transistor groups 223A_0 and 223B_0 and the transfer transistor groups 223A_1 and 223B_1 do not have mirror symmetry with respect to the memory cell array 210, and are configured to be moved in parallel in a side opposite to the memory cell array 210.

Effects According to the Fifth Embodiment

According to the fifth embodiment, the row decoder 220_0 is arranged on one side of the memory cell array 210, and the row decoder 220_1 is arranged on the other side of the memory cell array 210. The row decoder 220_0 includes the transfer transistor group 223A_0 for the blocks BLKa (blocks BLK1, BLK3, and BLK5) and the transfer transistor group 223B_0 for the blocks BLKb (blocks BLK0, BLK2, and BLK4), and the transfer transistor group 223A_0 and the transfer transistor group 223B_0 are sequentially arranged from the memory cell array 210 side. Meanwhile, the row decoder 220_1 includes the transfer transistor group 223A_1 for the blocks BLKa (blocks BLK1, BLK3, and BLK5) and the transfer transistor group 223B_1 for the blocks BLKb (blocks BLK0, BLK2, and BLK4), and the transfer transistor group 223B_1 and the transfer transistor group 223A_1 are sequentially arranged from the memory cell array 210 side.

In addition, voltages are applied to each of the word lines WL of the blocks BLKa from the transfer transistor group 223A_0 which is relatively close to one side of the word lines and from the transfer transistor group 223A_1 which is relatively distant from the other side of the word lines. In addition, voltages are applied to each of the word lines WL of the blocks BLKb from the transfer transistor group 223B_0 relatively distant from one side of the word lines and from the transfer transistor group 223B_1 relatively close to the other side of the word lines. Accordingly, it is possible to reduce resistance variation between the wires 224A_0 and 224A_1 extending from the blocks BLKa and the wires 224B_0 and 224B_1 extending from the blocks BLKb. As a result, it is possible to reduce operation speed variation between the blocks BLKa and the block BLKb.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first block that includes a first set of word lines;
a second block that includes a second set of word lines and is adjacent to the first block in a first direction;
a first transistor group adjacent to the first and second blocks in a second direction crossing the first direction, wherein each of the word lines in the first set is electrically connected to a transistor in the first transistor group; and
a second transistor group adjacent to the first transistor group in the second direction, wherein each of the word lines in the second set is electrically connected to a transistor in the second transistor group.

2. The device according to claim 1, wherein
the first set of word lines includes first and second word lines electrically connected respectively to first and second transistors, which are transistors in the first transistor group, and the second set of word lines includes third and fourth word lines electrically connected respectively to third and fourth transistors, which are transistors in the second transistor group, and
the first and second transistors are adjacent to each other in the first direction, and the third and fourth transistors are adjacent to each other in the first direction.

3. The device according to claim 2, wherein the first set of word lines includes a fifth word line electrically connected to a fifth transistor in the first transistor group, that is adjacent to the first transistor in the second direction.

4. The device according to claim 2, further comprising:
an element isolation area between the first transistor and the second transistor, and between the third transistor and the fourth transistor.

5. The device according to claim 1, further comprising:
a third block that includes a third set of word lines and is adjacent to the second block in the first direction,
wherein each of the word lines in the third set is electrically connected to a transistor in the first transistor group.

6. The device according to claim 1, further comprising:
a third block that includes a third set of word lines and is adjacent to the second block in the first direction,
wherein each of the word lines in the third set is electrically connected to a transistor in the second transistor group.

7. The device according to claim 5, wherein connection terminals between the word lines in the first set and the transistors in the first transistor group are located within a width of the first block in the first direction.

8. The device according to claim 1, further comprising:
a third block that includes a third set of word lines and is adjacent to the second block in the first direction; and
a third transistor group adjacent to the second transistor group in the second direction, wherein each of the word lines in the third set is electrically connected to a transistor in the third transistor group.

9. The device according to claim 1, further comprising:
a shield gate between the first and second transistor groups.

* * * * *